US012310001B2

(12) United States Patent
Alzate-Vinasco et al.

(10) Patent No.: US 12,310,001 B2
(45) Date of Patent: May 20, 2025

(54) DECOUPLING CAPACITORS AND METHODS OF FABRICATION

(71) Applicant: Intel Corporation, Santa Clara, CA (US)

(72) Inventors: Juan G. Alzate-Vinasco, Tigard, OR (US); Travis W. LaJoie, Forest Grove, OR (US); Wilfred Gomes, Portland, OR (US); Fatih Hamzaoglu, Portland, OR (US); Pulkit Jain, Hillsboro, OR (US); James Waldemer, Hillsboro, OR (US); Mark Armstrong, Portland, OR (US); Bernhard Sell, Portland, OR (US); Pei-Hua Wang, Hillsboro, OR (US); Chieh-Jen Ku, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 742 days.

(21) Appl. No.: 17/358,930

(22) Filed: Jun. 25, 2021

(65) Prior Publication Data

US 2022/0415896 A1 Dec. 29, 2022

(51) Int. Cl.
*H10B 12/00* (2023.01)
*H10D 30/01* (2025.01)
*H10D 30/67* (2025.01)

(52) U.S. Cl.
CPC ....... *H10B 12/315* (2023.02); *H10B 12/0335* (2023.02); *H10B 12/05* (2023.02); *H10D 30/031* (2025.01); *H10D 30/6728* (2025.01)

(58) Field of Classification Search
CPC .. H10B 12/03; H10B 12/033; H10B 12/0335; H10B 12/315; H01L 23/5223
See application file for complete search history.

(56) References Cited

U.S. PATENT DOCUMENTS

| | | | |
|---|---|---|---|
| 8,436,408 B2* | 5/2013 | Tu | H01L 28/40 438/957 |
| 2008/0122032 A1 | 5/2008 | Tu et al. | |
| 2010/0059806 A1* | 3/2010 | Mizushima | H01L 23/5223 257/E27.084 |

(Continued)

OTHER PUBLICATIONS

Extended European Search Report from European Application No. 22171295.3 notified Nov. 3, 2022, 9 pgs.

*Primary Examiner* — John P. Dulka
(74) *Attorney, Agent, or Firm* — Essential Patents Group, LLP

(57) ABSTRACT

A device structure includes transistors on a first level in a first region and a first plurality of capacitors on a second level, above the first level, where a first electrode of the individual ones of the first plurality of capacitors are coupled with a respective transistor. The device structure further includes a second plurality of capacitors on the second level in a second region adjacent the first region, where individual ones of the second plurality of capacitors include a second electrode, a third electrode and an insulator layer therebetween, where the second electrode of the individual ones of the plurality of capacitors are coupled with a first interconnect on a third level above the second level, and where the third electrode of the individual ones of the plurality of capacitors are coupled with a second interconnect.

20 Claims, 17 Drawing Sheets

(56) References Cited

U.S. PATENT DOCUMENTS

| | | | |
|---|---|---|---|
| 2012/0056298 A1* | 3/2012 | Kuroki | H01L 23/5225 |
| | | | 257/532 |
| 2013/0039113 A1 | 2/2013 | Cremer et al. | |
| 2015/0145011 A1* | 5/2015 | Nakamura | H10B 12/033 |
| | | | 257/306 |
| 2022/0375851 A1* | 11/2022 | Choi | H01L 28/90 |
| 2023/0387072 A1* | 11/2023 | Simsek-Ege | H10B 12/315 |

* cited by examiner

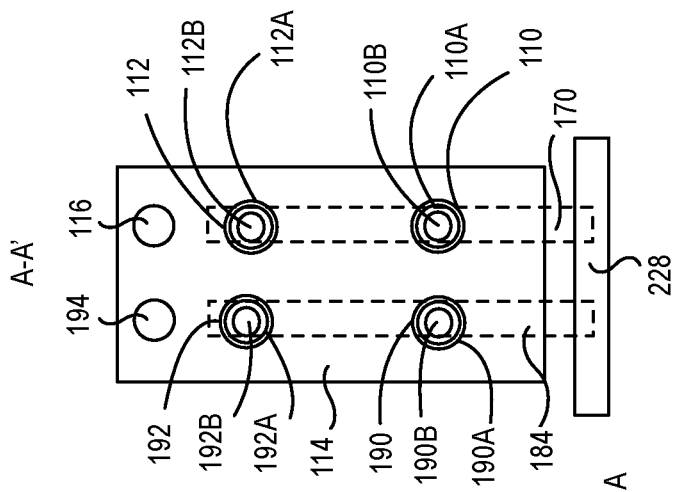
FIG. 1E
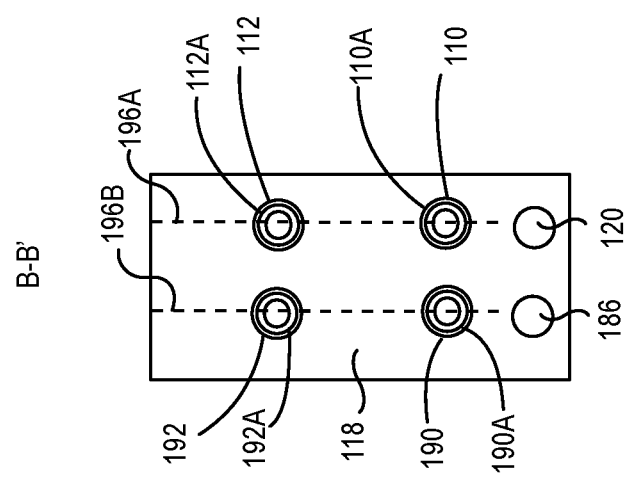
FIG. 1D
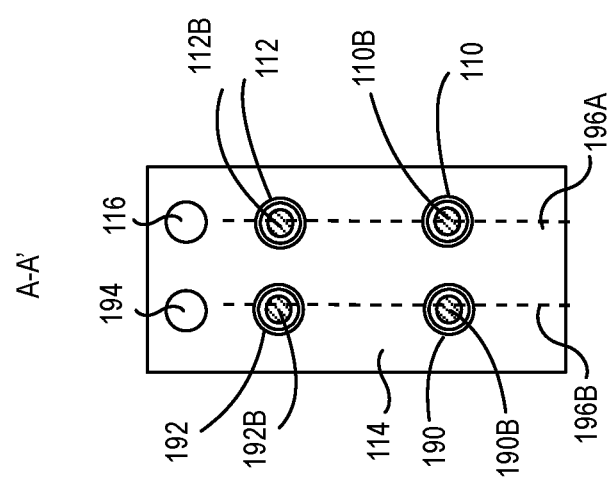
FIG. 1C
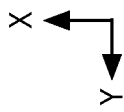

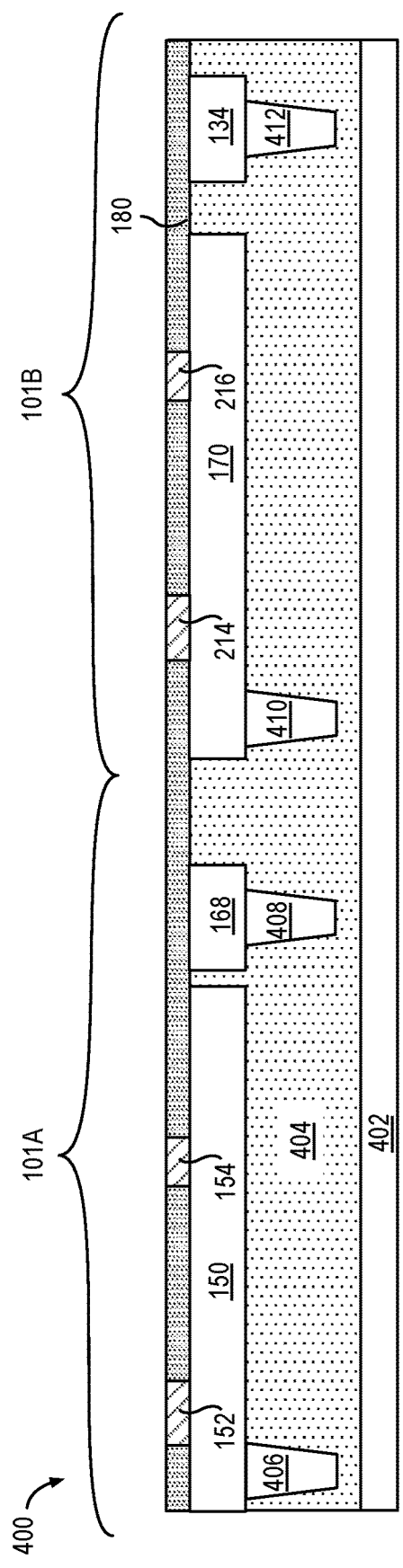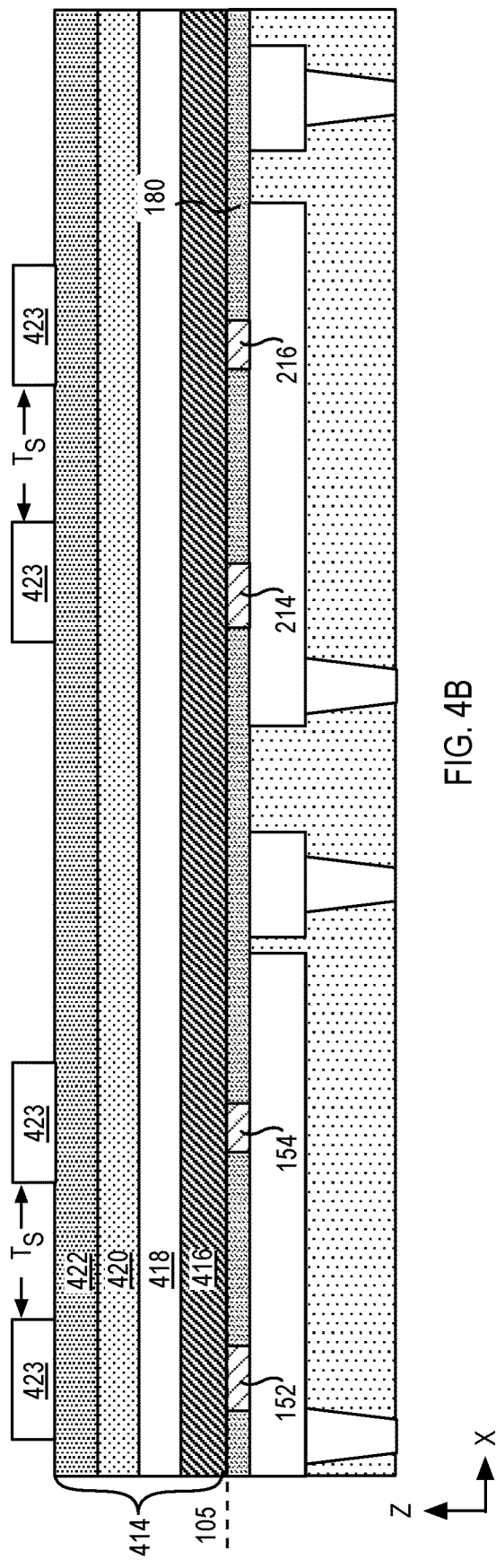

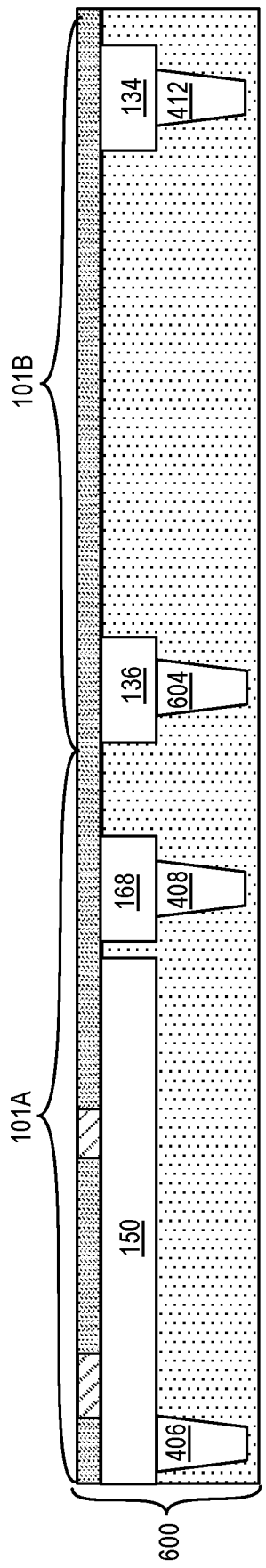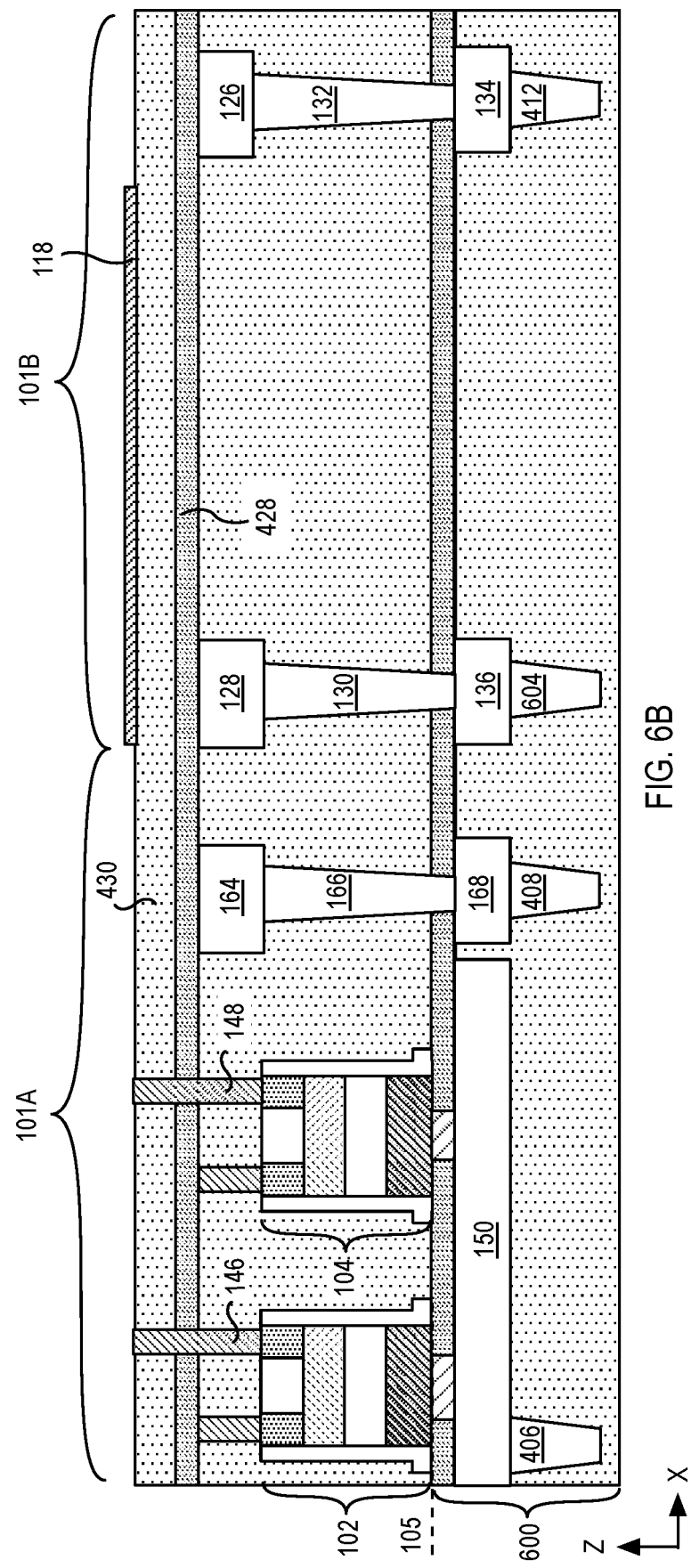

DECOUPLING CAPACITORS AND METHODS OF FABRICATION

BACKGROUND

Generally, decoupling capacitors are utilized for enabling reliable power delivery to active devices in a semiconductor chip. Decoupling capacitors can be integrated off chip or in the back end of the line (BEOL). However, external capacitors and routing lines can be a source of parasitic inductance and capacitance. Thus, there is a need to find a method to enable reliable power delivery and minimize parasitic inductance and capacitance.

BRIEF DESCRIPTION OF THE DRAWINGS

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

FIG. 1C is a plan-view illustration of a portion of the second region including a plurality of arrays of decoupling capacitors, where a first terminal of each of the decoupling capacitors are connected to a top conductive plate.

FIG. 1D is a plan-view illustration of a portion of the second region including a plurality of arrays of decoupling capacitors, where a second terminal of each of the decoupling capacitors are connected to a bottom conductive plate.

FIG. 1E is a is a plan-view illustration of a plurality of pairs of capacitors each coupled with a common electrode in the second region, in accordance with an embodiment of the present disclosure.

FIG. 4A is a cross-sectional illustration of a workpiece including a first word line fabricated in a first region and a second word line fabricated in a second region, in accordance with an embodiment of the present disclosure.

FIG. 4B is a cross-sectional illustration of the structure in FIG. 4A following the formation of a plurality of layers to form transistors in the first and in the second regions.

FIG. 6A is a cross-sectional illustration of a workpiece including a first word line fabricated in a first region, but no word line fabricated in a second region, in accordance with an embodiment of the present disclosure.

FIG. 6B is a cross-sectional illustration of the structure in FIG. 6A following the process to fabricate transistors, an interconnect and a metallization interconnect in the first region, and interconnects and metallization interconnects in the second region.

DETAILED DESCRIPTION

Figure 1A:
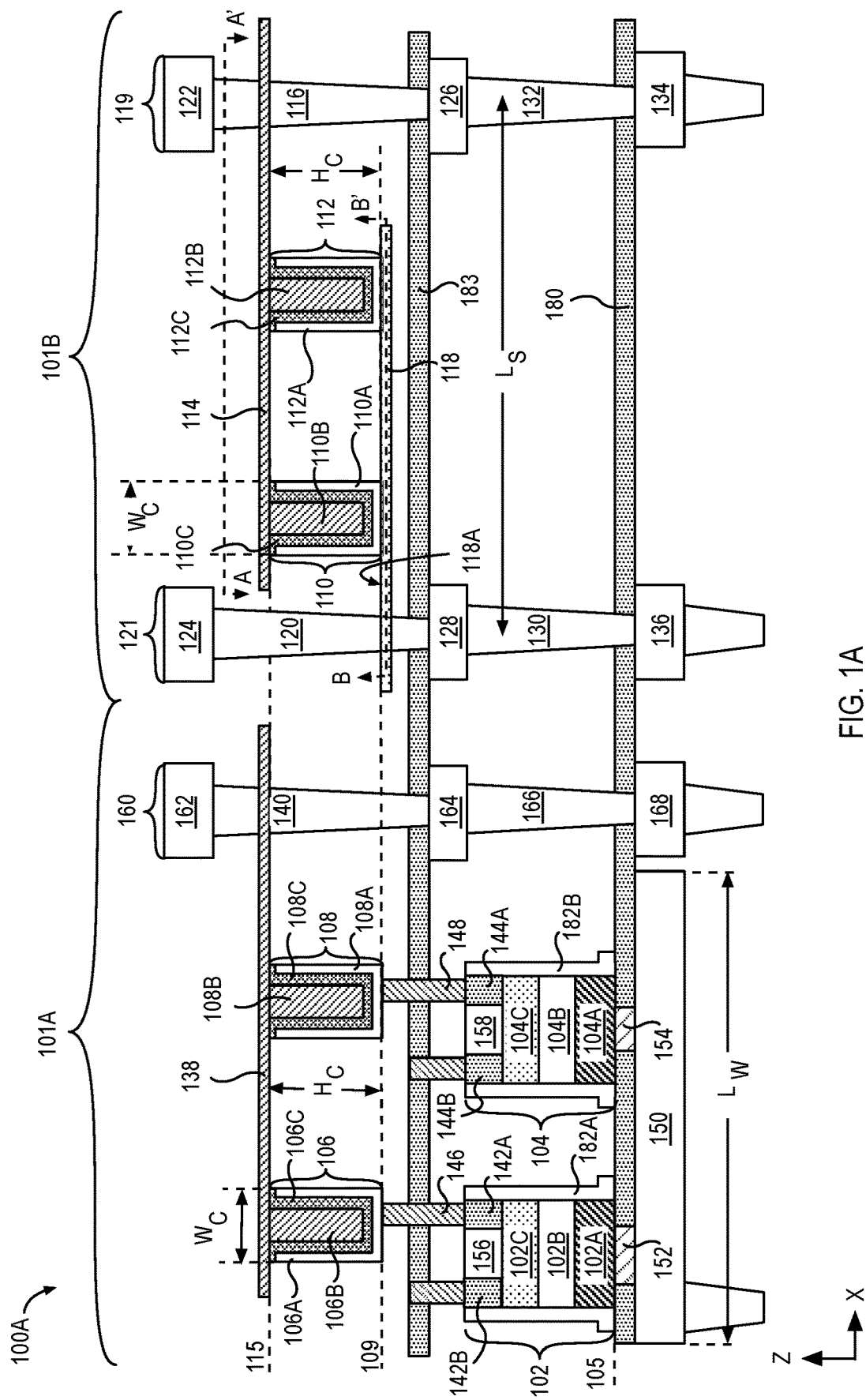
FIG. 1A is a cross-sectional illustration of a device structure including a first region including plurality of capacitor-transistor pairs and an adjacent second region including a plurality of decoupling capacitors, in accordance with an embodiment of the present disclosure.

The material described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Also, various physical features may be represented in their simplified "ideal" forms and geometries for clarity of discussion, but it is nevertheless to be understood that practical implementations may only approximate the illustrated ideals. For example, smooth surfaces and square intersections may be drawn in disregard of finite roughness, corner-rounding, and imperfect angular intersections characteristic of structures formed by nanofabrication techniques. Further, where considered appropriate, reference labels have been repeated among the figures to indicate corresponding or analogous elements.

Various configurations of decoupling capacitors using embedded DRAM metal insulator metal (MIM) cylindrical capacitors are described. In the following description, numerous specific details are set forth, such as structural schemes and detailed fabrication methods in order to provide a thorough understanding of embodiments of the present disclosure. It will be apparent to one skilled in the art that embodiments of the present disclosure may be practiced without these specific details. In other instances, well-known features, such as transistor operations and switching operations associated with capacitors, are described in lesser detail in order to not unnecessarily obscure embodiments of the present disclosure. Furthermore, it is to be understood that the various embodiments shown in the Figures are illustrative representations and are not necessarily drawn to scale.

In some instances, in the following description, well-known methods and devices are shown in block diagram form, rather than in detail, to avoid obscuring the present disclosure. Reference throughout this specification to "an embodiment" or "one embodiment" or "some embodiments" means that a particular feature, structure, function, or characteristic described in connection with the embodiment is included in at least one embodiment of the disclosure. Thus, the appearances of the phrase "in an embodiment" or "in one embodiment" or "some embodiments" in various places throughout this specification are not necessarily referring to the same embodiment of the disclosure. Furthermore, the particular features, structures, functions, or characteristics may be combined in any suitable manner in one or more embodiments. For example, a first embodiment may be combined with a second embodiment anywhere the particular features, structures, functions, or characteristics associated with the two embodiments are not mutually exclusive.

As used in the description and the appended claims, the singular forms "a", "an" and "the" are intended to include the plural forms as well, unless the context clearly indicates otherwise. It will also be understood that the term "and/or" as used herein refers to and encompasses any and all possible combinations of one or more of the associated listed items.

The terms "coupled" and "connected," along with their derivatives, may be used herein to describe functional or structural relationships between components. It should be understood that these terms are not intended as synonyms for each other. Rather, in particular embodiments, "connected" may be used to indicate that two or more elements are in direct physical, optical, or electrical contact with each other. "Coupled" may be used to indicated that two or more elements are in either direct or indirect (with other intervening elements between them) physical, electrical or in magnetic contact with each other, and/or that the two or more elements co-operate or interact with each other (e.g., as in a cause an effect relationship).

The terms "over," "under," "between," and "on" as used herein refer to a relative position of one component or material with respect to other components or materials where such physical relationships are noteworthy. For example, in the context of materials, one material or material disposed over or under another may be directly in contact or may have one or more intervening materials. Moreover, one material disposed between two materials may be directly in contact with the two layers or may have one or more intervening layers. In contrast, a first material "on" a second material is in direct contact with that second material/material. Similar distinctions are to be made in the context of component assemblies. As used throughout this description, and in the claims, a list of items joined by the term "at least one of" or "one or more of" can mean any combination of the listed terms.

The term "adjacent" here generally refers to a position of a thing being next to (e.g., immediately next to or close to with one or more things between them) or adjoining another thing (e.g., abutting it).

The term "signal" may refer to at least one current signal, voltage signal, magnetic signal, or data/clock signal. The meaning of "a," "an," and "the" include plural references. The meaning of "in" includes "in" and "on."

The term "device" may generally refer to an apparatus according to the context of the usage of that term. For example, a device may refer to a stack of layers or structures, a single structure or layer, a connection of various structures having active and/or passive elements, etc. Generally, a device is a three-dimensional structure with a plane along the x-y direction and a height along the z direction of an x-y-z Cartesian coordinate system. The plane of the device may also be the plane of an apparatus which comprises the device.

As used throughout this description, and in the claims, a list of items joined by the term "at least one of" or "one or more of" can mean any combination of the listed terms.

Unless otherwise specified in the explicit context of their use, the terms "substantially equal," "about equal" and "approximately equal" mean that there is no more than incidental variation between two things so described. In the art, such variation is typically no more than +/−10% of a predetermined target value.

The terms "left," "right," "front," "back," "top," "bottom," "over," "under," and the like in the description and in the claims, if any, are used for descriptive purposes and not necessarily for describing permanent relative positions. For example, the terms "over," "under," "front side," "back side," "top," "bottom," "over," "under," and "on" as used herein refer to a relative position of one component, structure, or material with respect to other referenced components, structures or materials within a device, where such physical relationships are noteworthy. These terms are employed herein for descriptive purposes only and predominantly within the context of a device z-axis and therefore may be relative to an orientation of a device. Hence, a first material "over" a second material in the context of a figure provided herein may also be "under" the second material if the device is oriented upside-down relative to the context of the figure provided. In the context of materials, one material disposed over or under another may be directly in contact or may have one or more intervening materials. Moreover, one material disposed between two materials may be directly in contact with the two layers or may have one or more intervening layers. In contrast, a first material "on" a second material is in direct contact with that second material. Similar distinctions are to be made in the context of component assemblies.

The term "between" may be employed in the context of the z-axis, x-axis or y-axis of a device. A material that is between two other materials may be in contact with one or both of those materials, or it may be separated from both of the other two materials by one or more intervening materials. A material "between" two other materials may therefore be in contact with either of the other two materials, or it may be coupled to the other two materials through an intervening material. A device that is between two other devices may be directly connected to one or both of those devices, or it may be separated from both of the other two devices by one or more intervening devices.

Reliable power delivery is an important area of interest for system on chip (SOC) design. High frequency fluctuations in current and voltage can adversely affect semiconductor devices. Decoupling capacitors are used as circuit elements to enable voltage control by filtering high frequency fluctuations. It is further advantageous to have such decoupling capacitors be part of the SOC to optimize power delivery network as well as improve the product/package interaction. Placement of decoupling capacitors within a chip is an ongoing topic of research.

Typically, decoupling capacitors are placed in an off-chip location, usually within the package. Such capacitors may have a planar metal-insulator-metal configuration (MIM) and can have very high charge storing capacities because of their sheer physical size. However, capacitors in either of these locations are limited by parasitic resistance and parasitic inductance as they are connected to the rest of the circuit through a long series of interconnects. Another location for decoupling capacitors within a chip is at an upper-back end of the line above a logic level. However, a MIM approach can make large metal layers unavailable for routing interconnects. Additionally, use of parallel plates in the MIM can limit the capacitance per area that can be achieved, translating into larger effective area of the decoupling capacitors. Reduction of resistance and parasitic inductance, effective capacitance value as well as voltage control at the device level are highly desirable.

Thus, decoupling capacitors placed in an on chip in the vicinity of logic and memory devices, for example, can have lower parasitic resistance and inductance because of their proximity. One such placement is within a logic region of a microprocessor providing a front-end (FE) transistor solution. However, such capacitors can have a limited charge storage capability or a limited achievable capacitance per unit area. Furthermore, such capacitors utilize valuable logic area that could be re-purposed.

The inventors have devised a solution that can integrate a decoupling capacitor at a device level and yet provide functionality as a circuit element for reliable power delivery. The solution includes integrating a MIM capacitor array alongside a region including embedded DRAM (eDRAM) devices. In some embodiments, the eDRAM devices include a logic transistor or a thin film transistor (TFT) coupled with a cup shaped MIM capacitor having an aspect ratio of at least 5:1. In exemplary embodiments, eDRAM devices include a TFT transistor coupled with a cup shaped MIM capacitor. In some such embodiments, the MIM capacitor array will include one or more features of the cup shaped MIM capacitor or be the same as the cup shaped MIM capacitor in the eDRAM device region. Furthermore, the capacitors in both regions can be on a same level and can be co-fabricated resulting in cost savings in fabrication. Integrating a cup shaped MIM capacitor in a region reserved for decoupling capacitors can reduce parasitic inductance because of shorter lengths of routing interconnects. In most examples, routing interconnects for eDRAM devices can be co-fabricated with routing interconnects for decoupling capacitors.

In one embodiment, the decoupling capacitors are the same as capacitors utilized in the eDRAM devices and are also coupled with TFT transistors like in the eDRAM counterpart. The difference between the devices in the two regions will be that the TFT transistors connected to decoupling capacitors have one or more terminals that are electrically tied at a common terminal.

In a second embodiment, the decoupling capacitors are not coupled with TFT transistors but the capacitors themselves can be substantially the same as the capacitors utilized in the eDRAM devices. The difference between the capacitors in the two regions is that a respective first terminal of each of the decoupling capacitors are electrically coupled and a respective second terminal of each of the decoupling capacitors are electrically coupled. In some embodiments, a conductive plate may be utilized to couple the first or the second terminals.

FIG. 1A is a cross-sectional illustration of a device structure 100A including a plurality of transistors, such as transistors 102 and 104 on a level 105 in a region 101A. The device structure 100A further includes, in region 101A, a plurality of capacitors such as capacitors 106 and 108 on a level 109, above level 105. In the illustrative embodiment, the capacitors 106 and 108 are examples of metal-insulator-metal (MIM) capacitors that have a high aspect ratio. An aspect ratio is defined as a ratio between a height, $H_C$ to width $W_C$ of each capacitor 106 and 108, where $H_C$ is measured relative to level 109. A high aspect ratio is typically above 5:1 and may be as much as 100:1. In the illustrative embodiment, a respective electrode 106A and 108A, of capacitors 106 and 108 are coupled with a source or a drain terminal of the respective transistors 102 and 104. Transistors 102 and 104 may be in the front end of the line or in a back end of the line above logic transistors. In the illustrative embodiment, a transistor-capacitor pair such as transistor 102 and capacitor 106 or transistor 104 and capacitor 108 is illustrated as an example of back-end of the line embedded DRAM memory cell.

Device structure 100A further includes a plurality of capacitors such as capacitors 110 and 112 are laterally adjacent to capacitors 106 and 108 on level 109, but in a region 101B adjacent to region 101A. In the illustrative embodiment, capacitors 110 and 112 are examples of decoupling capacitor that are connected in parallel in an electrical circuit within region 101B. In various embodiments, capacitors 110 and 112 are MIM capacitors. One terminal or electrode of the MIM capacitors 110 and 112 may be in series connection with a current source that is part of a power delivery network. In the illustrative embodiment, capacitors 110 and 112 are utilized as charge reservoirs utilized in clocks in the 1-5 GHz range and can serve abrupt changes in fluctuations in current demand. While only two capacitors 110 and 112 are shown, the number of such decoupling capacitors can be in the thousands within an array (such as along the x-direction). It can be advantageous to have a larger number of capacitors such as capacitors 110 and 112 in the vicinity of transistors 102 and 104 because such capacitors can cater to a large on-chip current demand, enable smoother power delivery as well as suppress higher frequency noise. When capacitors 110 and 112 are localized to the vicinity of the embedded DRAM memory cells, capacitors 110 and 112 can also be effective against high effective series inductance. A high effective series inductance can arise from long routing metallization interconnects when capacitors are not placed in the vicinity of the embedded DRAM memory cells.

In the illustrative embodiment, capacitor 110 includes an electrode 110A, an electrode 110B and an insulator layer 110C between electrodes 110A and 110B, and capacitor 112 includes an electrode 112A, an electrode 112B and an insulator layer 112C between electrodes 112A and 112B. Electrodes 110A and 112A may have a cup shape, and as shown in the cross-sectional illustration, are represented as having lateral portions (along the X-direction) and vertical portions (along the Z-direction). In the illustrative embodiment, vertical portions of the electrodes 110A and 112A laterally surround the electrodes 110C and 112C.

The storage capacity of capacitors 110 and 112 generally determined by the level and frequency of noise suppression required. In embodiments, the capacitors 110 and 112 have a same or substantially the same charge storage capacity as the capacitors 106 and 108. The charge storage is directly proportional to surface area of the electrodes of the capacitors 106, 108, 110 and 112. In some embodiments, capacitors 106, 108, 110 and 112 each have a same height, $H_C$, and a same lateral width $W_C$. In the illustrative embodiment, $W_C$ is representative of a lateral width of lateral portions of electrodes 106A, 108A, 110A and 112A. Depending on a plan view shape of the capacitors 106, 108, 110 and 112, $W_C$ may for example, be a length, width or a diameter. In other embodiments, capacitors 106, 108, 110 and 112 have a substantially same $H_C$ but different $W_C$. For example, the capacitors 110 and 112 may each have a $W_C$ that is up to three time greater than $W_C$ of the capacitors 106 and 108. In other examples, each of the respective capacitor 106 and 108 has a same $W_C$ and each of the respective capacitor 110 and 112 has a same $W_C$, but different from the $W_C$ of the capacitor 106 and 108. It is to be appreciated that in exemplary embodiments, capacitors 106, 108, 110 and 112 each have a same height, $H_C$ and is a byproduct of a processing methodology adopted to fabricate capacitors 106, 108, 110 and 112.

As shown, top portions or surfaces of each of the electrodes 110B and 112B are coupled together by a top conductive plate 114 extending laterally above each of the electrodes 110B and 112C. The top conductive plate 114 extends on a level 115, above level 109, and laterally extends over to an interconnect 116. In the illustrative embodiment, interconnect 116 is a via and the top conductive plate 114 divides the via into two vertical portions. The two vertical portions may or may not be of equal size. In the illustrative embodiment, interconnect 116 extends below level 109 as well as above level 115. In other embodiments, interconnect 116 is above level 115 and a separate interconnect is below level 115.

In the illustrative embodiment, lateral portions of electrodes 110A and 112A are coupled together by a bottom conductive plate 118 to enable simultaneous operation of capacitors 110 and 112. Lateral portions of electrodes 110A and 112A are on an uppermost surface 118A of the bottom conductive plate 118. As shown, bottom conductive plate 118 laterally extends to an interconnect 120. In the illustrative embodiment, the interconnect 120 is a via and the bottom conductive plate 118 vertically divides the via. The two vertical portions may or may not be of equal size, and as shown a smaller portion of interconnect 120 extends below level 109 and a larger portion above level 109. In other embodiments, interconnect 120 is only above level 109 and a separate interconnect is below the bottom conductive plate 118 and interconnect 120.

In an embodiment, the top conductive plate 114 and bottom conductive plate 118 each include a material that is different from a material of the metallization interconnect 122 or interconnects 130. The top conductive plate 114 and bottom conductive plate 118 may each include a material such as, but not limited to, titanium, tantalum, ruthenium, tungsten, or nitrides of titanium, tantalum, tungsten or ruthenium. Materials such as titanium, tantalum, ruthenium, tungsten, or nitrides of titanium, tantalum, tungsten or ruthenium offer ease in fabrication include patterning by plasma etch.

In the illustrative embodiment, interconnects 116 and 120 are components of interconnect structures 119 and 121, respectively. Interconnect structures 119 and 121 are each connected to external circuit elements such as power rails. Interconnect structures 119 and 121 may include several layers of interconnects and metallization interconnects such as lines and vias that extend from below level 105 to above level 115. In the illustrative embodiment, interconnects 116 and 120 are coupled above level 115, to metallization interconnects 122 and 124, respectively and below level 109 to metallization interconnects 126 and 128, respectively. In the illustrative embodiment, metallization interconnects 126 and 128 are further coupled with interconnects 130 and 132. The axial centers of interconnects 130 and 132 are laterally separated by a distance, Ls. Ls may be as much as a five hundred microns to facilitate an array of over 1000 capacitors on conductive plate 118. In exemplary embodiments, the conductive plate 118 also extends laterally to accommodate the array of capacitors. In the illustrative embodiment, interconnects 130 and 132 are further coupled with metallization interconnects 136 and 134, respectively, below level 105.

Referring again to region 101A, capacitors 106 and 108 have one or more features of the capacitors 110 and 112. In the illustrative embodiment, capacitor 106 includes an electrode 106A, an electrode 106B and an insulator layer 106C between electrodes 106A and 106B, and capacitor 108 includes an electrode 108A, an electrode 108B and an insulator layer 108C between electrodes 108A and 108B. Electrodes 106A and 108A may have a cup shape, and as shown in the cross-sectional illustration, are represented as having lateral portions (along the X-direction) and vertical portions (along the Z-direction). In the illustrative embodiment, vertical portions of the electrodes 106A and 108A laterally surround the electrodes 106C and 108C. In the illustrative embodiment, electrodes 106A and 108A are coupled to a respective terminal 142A and 144A of transistors 102 and 104, through metallization interconnects 146 and 148, respectively. Coupling between one electrode of each capacitor 106 and 108 and a terminal of each transistor 102 and 104, respectively, can facilitate independent programming of capacitors 106 and 108. In some embodiments, metallization interconnects 146 and 148 include a material of the metallization structure 122.

As shown, top portions or surfaces of each of the electrodes 106B and 108B are coupled together by a top conductive plate 138 extending laterally above each of the electrodes 106B and 108B. The top conductive plate 138 extends on level 115, and laterally over to an interconnect 140 in region 101A. Top conductive plate 138 serves a substantially same purpose as top conductive plate 114.

In the illustrative embodiment, the transistors 102 and 104 are BEOL TFT transistors. Transistors 102 and 104 span a height that is between levels 105 and 109. In an exemplary embodiment, transistors 102 and 104 are substantially identical, such as having a same gate electrode material, gate dielectric material and a same channel material.

The channel layers 102C and 104C may include semiconductor materials including, for example, n-type or p-type materials. In some embodiments, the channel layers 102C and 104C may include a high mobility oxide semiconductor material, such as tin oxide, antimony oxide, indium oxide, indium tin oxide, titanium oxide, zinc oxide, indium zinc oxide, indium gallium zinc oxide, gallium oxide, titanium oxynitride, ruthenium oxide, or tungsten oxide. In general, the channel layers 102C and 104C may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, indium gallium zinc oxide (IGZO), indium telluride, molybdenite, molybdenum diselenide, tungsten diselenide, tungsten disulfide, n- or p-type amorphous or polycrystalline silicon, germanium, indium gallium arsenide, silicon germanium, gallium nitride, aluminum gallium nitride, indium phosphite, and black phosphorus, each of which may possibly be doped with one or more of gallium, indium, aluminum, fluorine, boron, phosphorus, arsenic, nitrogen, tantalum, tungsten, and magnesium, etc. In particular, the channel layers 102C and 104C may be formed of a thin film material. Some such materials may be deposited at relatively low temperatures, which allows depositing them within the thermal budgets imposed on back-end fabrication to avoid damaging any front-end components. In some embodiments, the channel layers 102C and 104C may have a thickness between about 5 nm and 30 nm.

In various embodiments, the gate dielectric layers 102B and 104B includes one or more high-k dielectric materials and may include elements such as hafnium, silicon, oxygen, titanium, tantalum, lanthanum, aluminum, zirconium, barium, strontium, yttrium, lead, scandium, niobium, and zinc. Examples of high-k materials that may be used in the gate dielectric layers 102B and 104B may include, but are not limited to, hafnium oxide, hafnium silicon oxide, lanthanum oxide, lanthanum aluminum oxide, zirconium oxide, zirconium silicon oxide, tantalum oxide, titanium oxide, barium strontium titanium oxide, barium titanium oxide, strontium titanium oxide, yttrium oxide, aluminum oxide, tantalum oxide, tantalum silicon oxide, lead scandium tantalum oxide, and lead zinc niobate. In some embodiments, an annealing process may be carried out on the gate dielectric layers 102B and 104B during manufacture of the transistors 106 and 108 to improve the quality of the gate dielectric layers 102B and 104B. In some embodiments, the gate dielectric layers 102B and 104B have a thickness between about 0.5 nanometers and 3 nanometers, including all values and ranges therein, e.g., between about 1 and 3 nanometers, or between about 1 and 2 nanometers.

The gate electrodes 102A and 104A may include at least one p-type work function metal or n-type work function metal, depending on whether the transistors 106 and 108, respectively, are a P-type metal oxide semiconductor (PMOS) transistors or N-type metal oxide semiconductor (NMOS) transistors. For a PMOS transistor, the gate electrodes 102A and 104A may include a metal such as, but are not limited to, ruthenium, palladium, platinum, cobalt or nickel, or conductive metal oxides (e.g., ruthenium oxide). For an NMOS transistor, gate electrodes 102A and 104A may include a metal such as, but are not limited to hafnium, zirconium, titanium, tantalum, aluminum, or alloys of these metals, or carbides of these metals (e.g., hafnium carbide, zirconium carbide, titanium carbide, tantalum carbide, and aluminum carbide). In some embodiments, the gate electrodes 102A and 104A includes a stack of two or more metal layers, where one or more metal layers are work function metal layers and at least one metal layer is a fill metal layer. Further metal layers may be included for other purposes, such as to act as a diffusion barrier layer, where the diffusion barrier layer may be directly adjacent to the via 152 and 154.

The transistors 102 and 104 may be further electrically coupled together, such as, by a respective gate electrode to minimize routing interconnects. For example, as shown, gate electrodes 102A and 104A of transistors 102 and 104, respectively may be both coupled below level 105 to a word line 150. In the illustrative embodiment, a via 152 facilitates coupling between the gate electrode 102A and the wordline 150 and via 154 facilitates coupling between the gate electrode 104A and the wordline 150. Vias 152 and 154 may be an artifact of a fabrication scheme. As shown an etch stop layer 180 may be implemented on the word line 150 to facilitate fabrication of transistors on the word line 150. The vias 152 and 154 are within a portion of the etch stop layer 180.

Even through gate electrodes 102A and 104A are electrically coupled, transistors 102 and 104 may still be operated independently by independently programming source terminals of each respective transistor 102 and 104. As shown, transistor 102 includes a source terminal 142B opposite to drain terminal 142A, where source and drain terminals 142B and 142A are above a channel layer 102C. Also as shown terminals 142B and 142A are separated by an insulator 156. Transistor 102 further includes a gate dielectric layer 102B between gate electrode 102A and channel layer 102C. As shown, transistor 104 includes a source terminal 144B opposite to drain terminal 144A, where source and drain terminals 144B and 144A, respectively are above a channel layer 102C. Also as shown, terminals 144B and 144A are separated by an insulator 158. Transistor 104 further includes a gate dielectric layer 104B between gate electrode 104A and channel layer 104C.

In the illustrative embodiment, interconnect 140 is a component of an interconnect structure 160. In the illustrative embodiment, interconnect 140 is a via and top conductive plate 138 divides the via 140 into two vertical portions. The two vertical portions may or may not be of equal size. In the illustrative embodiment, interconnect 140 extends below level 109 as well as above level 115. In other embodiments, interconnect 140 is above level 115.

Interconnect structure 160 may include several layers of interconnects and metallization interconnects such as lines and via that span a vertical dimension that extends from below level 105 to above level 115. Interconnect structure 160 is connected to external circuit elements such as power rails. Interconnect structure 160 include several layers of interconnects and metallization interconnects such as lines and via that span a vertical dimension that extends from below level 105 to above level 115. In the illustrative embodiment, interconnect 140 is coupled above level 115, to metallization interconnect 162, respectively and below level 109 to metallization interconnect 164. In the illustrative embodiment, metallization interconnect 164 is further coupled with interconnect 166 below. In the illustrative embodiment, interconnect 166 is further coupled with metallization interconnect 168 below level 105. The device structure 100A may further include one or more etch stop layers such as etch stop layer 183 above the metallization interconnects 126, 128 and 164 to facilitate fabrication. The etch stop layers 180 and 183 may include a material such as silicon and one or more of nitrogen, oxygen or carbon. In the illustrative embodiment, metallization interconnect 164 is on a same level as metallization interconnects 126 and 128 in region 101B, interconnect 166 is on a same level as interconnects 130 and 132, and metallization interconnect 168 is on a same level as metallization interconnect 136 and 134 as well as wordline 150. In embodiments, word line 150 spans a length Lw, that is over 100 microns.

In embodiments, the metallization interconnects 122, 124, 126, 128, 136, 134, 162, 164 and 168, and interconnects 116, 120, 130, 132, 140, and 166 each include a same or a substantially same material. In some embodiments, the metallization interconnects 122, 124, 126, 128, 136, 134, 162, 164 and 168, and interconnects 116, 120, 130, 132, 140, and 166 each include a metal-diffusion barrier material such as ruthenium, tantalum nitride (TaN), tantalum (Ta), titanium zirconium nitride (e.g., TixZr1-xN, such as X=0.53), titanium nitride (e.g., TiN) or titanium tungsten (TiW) in a cup shape and a conductive material such as copper, tungsten, molybdenum on the cup shape metal-diffusion barrier material. In exemplary embodiments, the conductive material is copper (Cu) which provides much lower resistance compared to other metals such as aluminum, tungsten, titanium.

In the illustrative embodiment, a spacer 182A is laterally adjacent to sidewalls of transistor 102, and a spacer 182B is laterally adjacent to sidewalls of the transistor 104. Spacers 182A and 182B protect lateral encroachment of oxygen, at interfaces between layers 102B and 102C, and between 104B and 104C, respectively. Spacers 182A and 182B are also designed to hermetically seal the layers in transistors 102 and 104 and include silicon and one or more of oxygen, nitrogen or carbon.

Figure 1B:
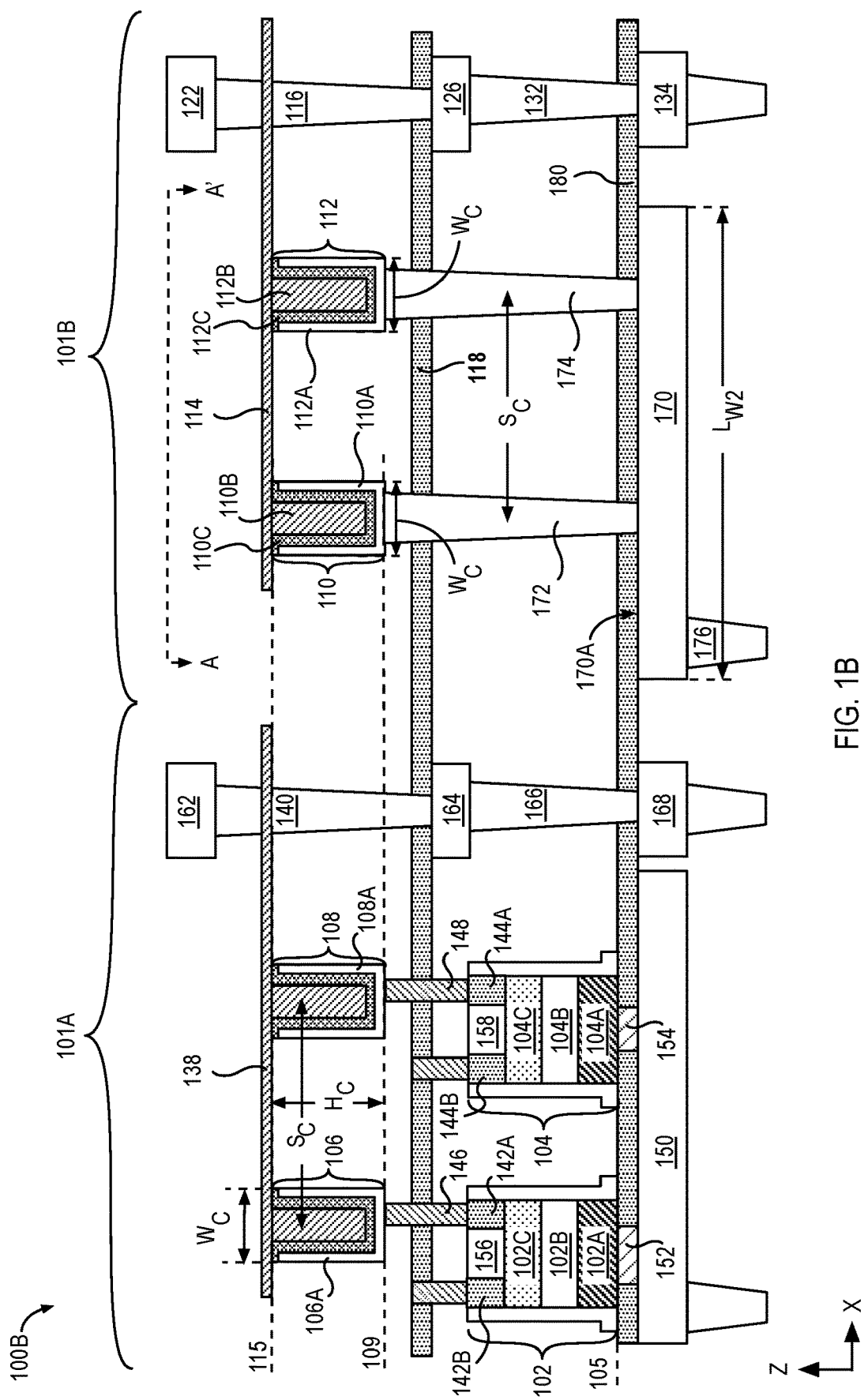
FIG. 1B is a cross-sectional illustration of a device structure including a first region including plurality of capacitor-transistor pairs and an adjacent region including a plurality of decoupling capacitors, in accordance with an embodiment of the present disclosure.

To facilitate fabrication, in some embodiments, the bottom conductive plate 118 may be replaced by a common electrode. FIG. 1B is a cross-sectional illustration of the structure in FIG. 1A, where the bottom conductive plate 118 (in FIG. 1A) is replaced by a common electrode 170 and interconnect structure 121 is removed from the device structure 100B in region 101B. In an embodiment, the common electrode 170 is an example of a word line 170 (herein word line 170) and is on the same level as the word line 150 in region 101A. In the illustrative embodiment, a plurality of vias, such as vias 172 and 174 are on and in contact with an uppermost surface 170A of the word line 170. As shown, individual ones of the vias 172 and 174 are further coupled with the respective electrode 110A and 112A of the capacitors 110 and 112. In exemplary embodiments each via 172 and 174 is spatially confined below the electrode 110A and 112A, respectively.

The capacitors 110 and 112 and via 172 and 174 may each have a cylindrical profile. In some such embodiments, axial centers of a respective capacitor and via pairs such as capacitor 110 and via 172, and capacitor 112 and via 174 are substantially aligned. In the illustrative embodiment, axial centers of the via 172 and 174 are separated by a lateral spacing Sc and each of the capacitors 110 and 112 are separated by a lateral spacing Sc. In some embodiments, capacitors 106 and 108 may each have a cylindrical profile. In some such embodiments, axial centers of respective capacitors 106 and 108 are also laterally spaced apart by a lateral spacing Sc Where capacitors 106, 108, 110 and 112 have a plan view shape that is not circular the spacing Sc may refer to a respective spacing between an axial center of capacitor pairs 106 and 108, and capacitor pairs 110 and 112.

While two capacitors are shown, in embodiments, region 101B can includes over 1000 capacitors in an array along the x-direction, where each successive capacitor and via pair are laterally separated (along x-direction) from an adjacent capacitor and via pair by a spacing, Sc. In exemplary embodiments, Sc is substantially the same between each successive capacitor and via pair. In at least some embodiments, where there are at least three capacitors and where at least two capacitors have a different $W_C$, the spacing Sc between a first capacitor and via pair and a second laterally separated capacitor and via pair, can be different from a spacing between the second laterally separated capacitor and via pair and a third laterally separated capacitor and via pair.

As shown, the word line 170 has a length, $L_{W2}$ (measured along the x-direction). $L_{W2}$ can be extended to accommodate a required number of capacitors such as capacitors 110 and 112. The word line 170 may be coupled to a via 176 as shown. Metallization interconnect 122 and via 176 may be in series with external circuit elements.

While a single row of decoupling capacitors is illustrated in FIGS. 1A and 1B, the device structure 100A and 100B include eDRAM cells in region 101A and decoupling capacitors in region 101B that are stacked behind the plane of the device structure depicted in the respective figure. FIG. 1C is a plan view illustration along the line A-A' in the structure of FIG. 1A and illustrates two rows 196A and 196B of decoupling capacitors. The capacitors 110 and 112 are superimposed in the illustration to provide context. As shown, a plurality of capacitors 190 and 192 are laterally spaced apart in a row 196B along a direction parallel to the x-axis. As shown, top conductive plate 114 laterally extends over the capacitors 190 and 192 in addition to being over capacitors 110 and 112. In an embodiment, the capacitors 190 and 192 are substantially identical to capacitors 110 and 112. As shown, electrode 190B and electrode 192B (inner electrodes) are coupled with the top conductive plate 114. As shown, an interconnect 194, which includes one or more features of the interconnect 116, is also coupled with the top conductive plate 114. In the illustrative embodiment, the interconnect 194 is substantially aligned along the x-direction in the same row 196B as the capacitors 190 and 192.

FIG. 1D is a plan view illustration along the line B-B' in the structure of FIG. 1A. The capacitors 110, 112, 190 and 192 are superimposed to provide context. In the illustrative embodiment, capacitors 190 and 192 are laterally spaced apart along the row 196B. As shown the bottom conductive plate 118 laterally extends under capacitors 190 and 192 in addition to being under capacitors 110 and 112.

The capacitors 190 and 192 are substantially identical to capacitors 110 and 112, and as shown electrode 190A and electrode 192A (outer electrodes) are coupled with the bottom conductive plate 118. As shown, an interconnect 186 is also coupled with the bottom conductive plate 118. In the illustrative embodiment, the interconnect 186 is substantially aligned along the x-direction in the same row 196B as the capacitors 190 and 192.

FIG. 1E is a plan view illustration along the line A-A' in the structure of FIG. 1B. The capacitors 110, 112, and capacitors 190 and 192 are superimposed to provide context. As shown the top conductive plate 114 laterally extends over the capacitors 190 and 192 that are laterally spaced apart along a row parallel to the x-axis. The capacitors 190 and 192 are substantially identical to capacitors 110 and 112, and as shown electrode 190B and electrode 192B (inner electrodes) are coupled with the top conductive plate 114. As shown, an interconnect 194 is also coupled with the top conductive plate 114.

In the illustrative embodiment, word line 184 extends longitudinally parallel to the word line 170. Electrodes 190A and 192A (outer electrodes) are coupled with the word line 184 and electrodes 110A and 112A are coupled with the word line 170. In the illustrative embodiment, the interconnect 194 is substantially longitudinally aligned with the word line 184. The conductive plate 114 intersects both the interconnects 116 and 194.

In a third embodiment, the vias 172 and 174 described in association with FIG. 1B may be replaced by transistors.

Figure 2A:
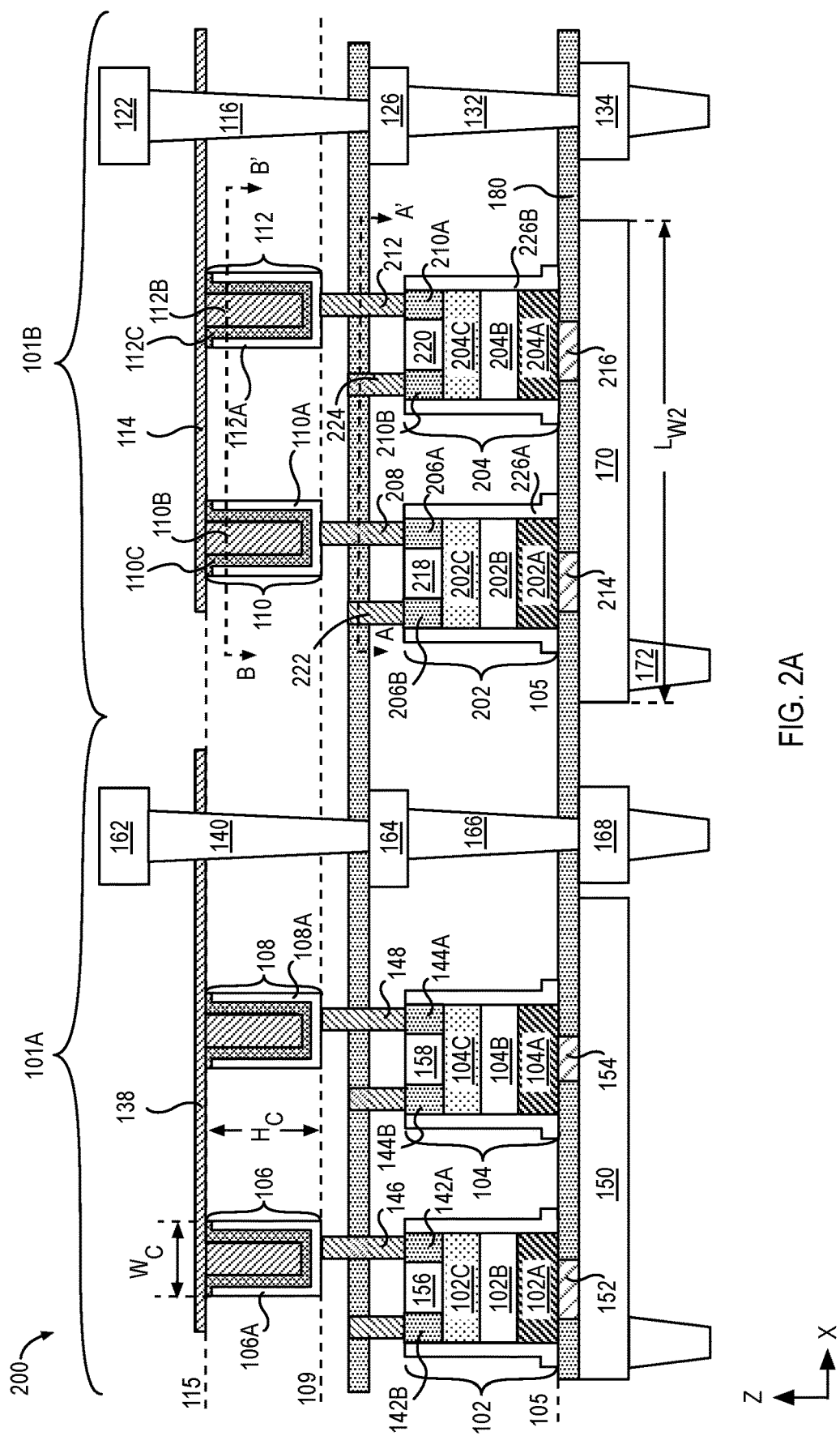
FIG. 2A is a cross-sectional illustration of a device structure including a first region including a first plurality of capacitor-transistor pairs and an adjacent region including a second plurality of decoupling capacitor-transistor pairs, in accordance with an embodiment of the present disclosure.

FIG. 2A is a cross-sectional illustration of a device structure 200, where vias 172 and 174 (FIG. 1B) are replaced by transistors 202 and 204, respectively. In exemplary embodiments, transistors 202 and 204 are structurally identical to transistors 102 and 104, respectively and are BEOL TFT transistors. In some such embodiments, capacitors 110 are 112 are each coupled to a respective drain terminal of each transistor 202 and 204. As shown, electrode 110A is coupled to drain terminal 206A of transistor 202 through a via 208 and electrode 112A is coupled to drain terminal 210A of transistor 204 though a via 212.

Transistors 202 and 204 span a height that extends between levels 105 and 109. In an exemplary embodiment, transistors 202 and 204 are substantially identical, such as having a same gate electrode material, gate dielectric material and a same channel material. The transistors 202 and 204 are further electrically coupled together, such as, by a respective gate electrode. For example, as shown, gate electrodes 202A and 204A of transistors 202 and 204, respectively may be both coupled below level 105 to the word line 170. In the illustrative embodiment, a via 214 facilitates coupling between the gate electrode 202A and the wordline 170 and via 216 facilitates coupling between the gate electrode 204A and the wordline 170. Vias 214 and 216 may be an artifact of a fabrication scheme.

As shown, transistor 202 includes a source terminal 206B opposite to drain terminal 206A, where source and drain terminals 206B and 206A are above a channel layer 202C. Also as shown, terminals 206B and 206A are separated by an insulator 218. Transistor 202 further includes a gate dielectric layer 202B between gate electrode 202A and channel layer 202C. As shown, transistor 204 includes a source terminal 210B opposite to drain terminal 210A, where source and drain terminals 210B and 210A are above a channel layer 204C. Also as shown, terminals 210B and 210A are separated by an insulator 220. Transistor 204 further includes a gate dielectric layer 204B between gate electrode 204A and channel layer 204C.

In addition to gate electrodes 202A and 204A being electrically coupled, source terminals 206B and 210B of transistors 202 and 204, respectively, are also coupled with each other. In the illustrative embodiment, the device structure 200 includes metallization interconnects 222 and 224 that are on source terminals 206B and 210B, respectively. Metallization interconnects 222 and 224 extend along a direction that is out of the plane in the illustration of the FIG. 2A. As shown in FIG. 2B, metallization interconnects 222 and 224 are both coupled to an interconnect structure 226. In the illustrative embodiment, interconnect structure 226 extends along a direction that is orthogonal to a longitudinal direction of the metallization interconnects 222 and 224.

Referring again to FIG. 2A, a spacer 226A is laterally adjacent to sidewalls of transistor 202, and a spacer 226B is laterally adjacent to sidewalls of the transistor 204. Spacers 226A and 226B protect lateral encroachment of oxygen, at interfaces between layers 202B and 202C, and between 204B and 204C, respectively. Spacers 226A and 226B are also designed to hermetically seal the layers in transistors 202 and 204.

Figure 2C:
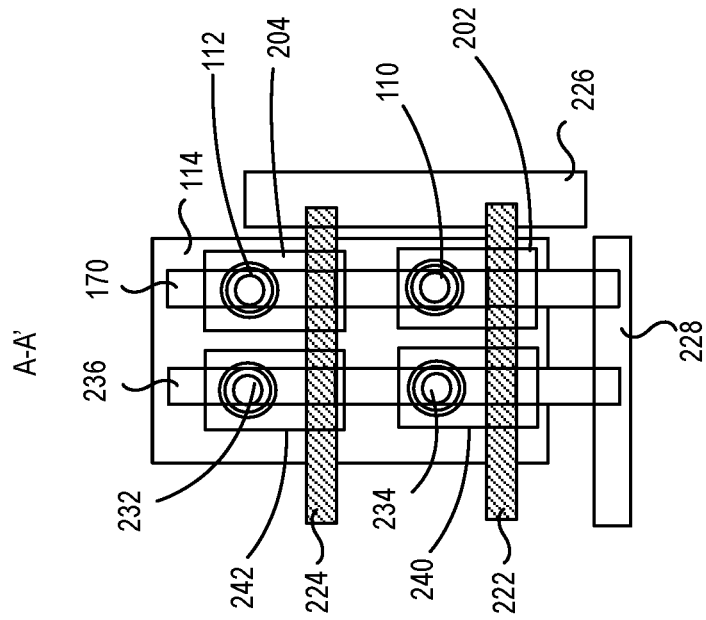
FIG. 2C is an enhanced plan-view illustration of a portion of a second region through a line B-B' of the structure in FIG. 2A, illustrating coupling between source terminals of two adjacent transistors and coupling between word lines of transistors in two parallel arrays.
Figure 2B:
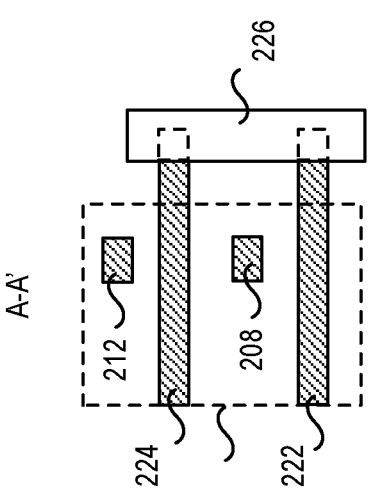
FIG. 2B is an enhanced plan-view illustration of a portion of a second region through a line A-A' of the structure in FIG. 2A, illustrating coupling between source terminals of two adjacent transistors.

FIG. 2C is a plan view illustration through the line B-B' in the structure of FIG. 2A. Other layers are also superimposed to provide context. As shown capacitors 110 and 112 are over a single word line 170. A word line 236 is parallel to word line 170, where capacitors 232 and 234 are over and coupled with a word line 236. Top conductive plate 114 also further extends over and is coupled with capacitors 232 and 234. Also as shown in the illustration, word lines 170 and 236 are coupled together by an interconnect 228 that is arranged parallel to the interconnects 222 and 224 and orthogonal to interconnect 226. Thus, a single voltage applied on three terminals can simultaneously energize all the capacitors in the 2 by 2 array shown. For example, a top conductive plate 114 can simultaneously bias one electrode of capacitors 110, 112, 232 and 234, interconnect 228 can simultaneously bias a gate electrode of each transistor coupled with a respective capacitor 110, 112, 232 and 234, and interconnect 226 can simultaneously bias all source terminals of each transistor coupled to a respective capacitor 110, 112, 232 and 234. In embodiments, the array can include 1000 by 100 number of capacitors. In exemplary embodiments, the capacitors 232 and 234 are the same or substantially the same as capacitors 110 or 112, and word line 236 includes properties that are the same as properties of the word line 170.

In the illustrative embodiment, the word line 236 is further coupled with transistors 240 and 242. Transistor 240 has a source terminal (not visible in illustration) that is coupled with metallization interconnects 222, and transistor 242 has a source terminal (not visible in illustration) that is coupled with metallization interconnects 224.

Figure 3:
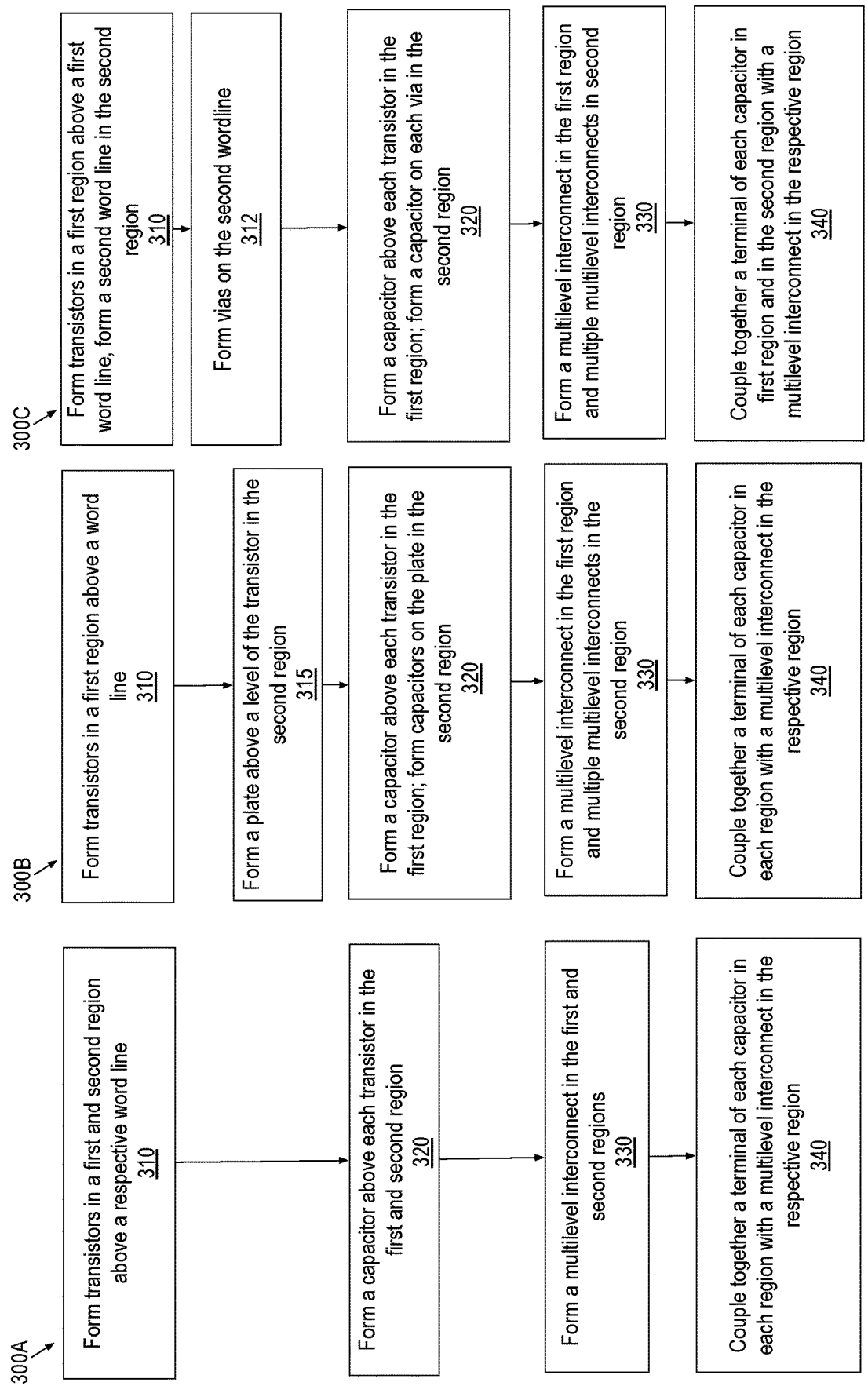
FIG. 3 is an illustration of various flow charts for methods to fabricate several different types of decoupling capacitors, according to embodiments of the present disclosure.

FIG. 3 is an illustration of various flow charts for methods to fabricate several different types of decoupling capacitors, according to embodiments of the present disclosure. Method 300A begins at operation 310 by forming transistors in a first and in a second region above a respective word line in each region. The method 300A continues at operation 320 with the formation of a plurality of capacitors and coupling a first terminal of each of the plurality of capacitors with a terminal of each transistor in the first and in the second regions. The method 300A continues at operation 330 with the formation of multilevel interconnects in the first and in the second region. And the method 300A concludes at operation 340 by coupling together a second terminal of each of the plurality of capacitors in each region with a single multilevel interconnect.

The method 300B begins by formation of a plurality of transistors above a word line in a first region. The method 300B continues at operation 315 by formation of a plate in the second region, above level of the plurality of transistors. The method 300B continues at operation 320 by the formation of a first plurality of capacitors in the first region and coupling a first terminal of each of the first plurality of capacitors with a terminal of each transistor in the first region, and formation of a second plurality of capacitors on the plate in the second region. The method 300B continues at operation 330 with the formation of a multilevel interconnect in the first and multiple multilevel interconnects in the second region. And the method 300B concludes at operation 340 by coupling together a second terminal of each of the plurality of capacitors in each region with a single multilevel interconnect.

The method 300C begins by formation of a plurality of transistors above a first word line in a first region and formation of a second word line in a second region. The method 300C continues at operation 312 by formation of a plurality of vias on the second wordline. The method 300C continues at operation 320 by the formation of a first plurality of capacitors in the first region and forming a capacitor on each via. The method 300C continues at operation 330 with the formation of a multilevel interconnect in the first and multiple multilevel interconnects in the second region. And the method 300C concludes at operation 340 by coupling together a second terminal of each of the plurality of capacitors in each region with a single multilevel interconnect in the respective region.

FIG. 4A is a cross-sectional illustration of a workpiece 400 including a word line 150 in a region 101A, and a word line 170 in a region 101B, where word lines 150 and 170 are fabricated in a dielectric 404, formed above a substrate 402, in accordance with an embodiment of the present disclosure. In an embodiment, the dielectric 404 is blanket deposited by a (PECVD) or a chemical vapor deposition (CVD) process. In an embodiment, the dielectric 404 includes silicon and one or more of nitrogen, oxygen and carbon, for example, silicon nitride, silicon dioxide, carbon doped silicon nitride, silicon oxynitride or silicon carbide. In some embodiments, an opening is formed in the dielectric 404 and a conductive material is deposited into the opening to form a plurality of vias 406, 408, 410 and 412. In exemplary embodiments, the conductive material is copper (Cu) which provides much lower resistance compared to other metals such as aluminum, tungsten, titanium. In some embodiments, metal-diffusion barrier material such as ruthenium, tantalum nitride (TaN), tantalum (Ta), titanium zirconium nitride (e.g., TixZr1-xN, such as X=0.53), titanium nitride (e.g., TiN) or titanium tungsten (TiW) is deposited prior to deposition of the conductive material. The conductive material and the metal-diffusion barrier material is then planarized to form the vias 406, 408, 410 and 412. The process is repeated to form word line 150 and metallization interconnect 168 in region 101A, and word line 170 and metallization interconnect 134 in region 101B.

An etch stop layer 180 is blanket deposited on the dielectric 404, by a (PECVD) or a chemical vapor deposition (CVD) process. In some embodiments, the etch stop layer 180 includes silicon and nitrogen, or silicon and nitrogen and one or more of oxygen or carbon e.g., carbon doped silicon nitride, silicon oxynitride or silicon carbide. Openings are formed in the etch stop layer 180 and a conductive material is deposited into the opening to form vias 152, 154 on the word line 150 in region 101A and vias 214 and 216 on the word line 170 in region 101B.

FIG. 4B is a cross-sectional illustration of the structure in FIG. 4A following the formation of a plurality of layers to form transistors in regions 101A and 101B. In an embodiment, a material layer stack 414 including individual layers of a transistor are sequentially blanket deposited in regions 101A and 101B. In the illustrative embodiment, embodiment, a gate electrode material 416 is blanket deposited on vias 152, 154, 214 and 216 and on the etch stop layer 180, simultaneously, in regions 101A and 101B. A gate dielectric layer 418 is deposited on the gate electrode material 416 and a channel material 420 is deposited on the gate dielectric layer 418. In the illustrative embodiment, a conductive material 422 (for a source or a drain) is deposited on the channel material. In an embodiment, the gate electrode material 416 is blanket deposited by a PVD or a PECVD or an ALD process. In exemplary embodiments, gate electrode material 416 includes a material that is the same or substantially the same as the material of the gate electrode 102A or 104A. In an embodiment, the gate dielectric layer 418 is deposited by an atomic layer deposition (ALD) process. In exemplary embodiments, gate dielectric layer 418 includes a material that is the same or substantially the same as the material of the gate dielectric layer 102B or 104B. In an embodiment, the channel material 420 is deposited on the gate dielectric layer by a PVD or a PECVD process. In embodiments, channel material 420 includes a material that is the same or substantially the same as the material of the channel layer 102C or 104C. In an embodiment, the conductive material 422 is deposited by a PVD or a PECVD process. In exemplary embodiments, conductive material 422 includes a material that is the same or substantially the same as the material of the source 142B or drain 142A.

In an embodiment, a mask 423 is formed on the conductive layer 422. The mask 423 may be lithographically patterned or may include a dielectric material. The mask 423 defines locations where transistors are to be formed above each via 152, 154, 214 and 216. The mask 423 also defines the lateral width, $W_T$ of transistors to be formed and a space, $TS$, between two adjacent transistors.

In some embodiments, the conductive material may be deposited by a damascene process after patterning of the channel material 420, gate dielectric layer 418 and the gate electrode material 416.

Figure 4C:
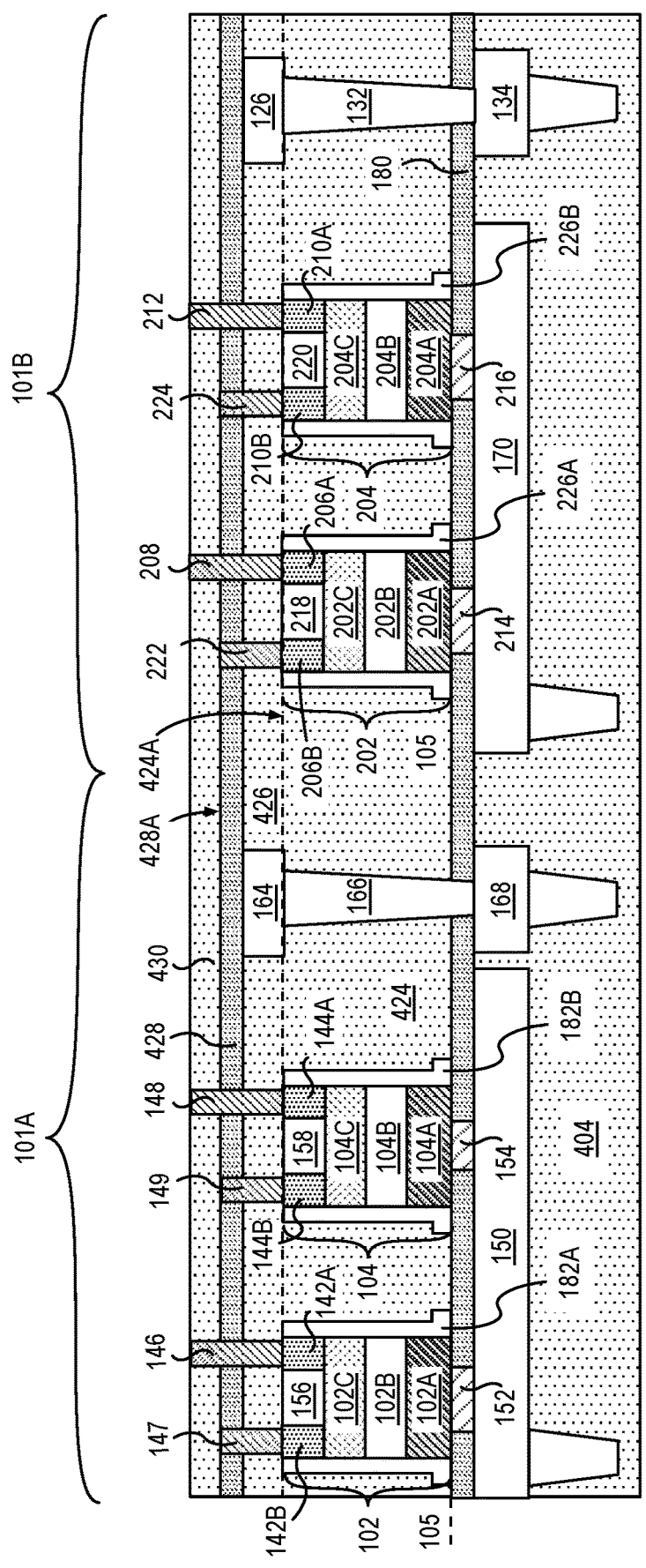
FIG. 4C is a cross-sectional illustration of the structure in FIG. 4B following a patterning process to form of a plurality of transistors in the first and in the second regions, in accordance with an embodiment of the present disclosure.

FIG. 4C is a cross-sectional illustration of the structure in FIG. 4B following a patterning process to form of a plurality of transistors in region 101A and a plurality of transistors in region 101B. As shown the patterning process forms a transistor 102 on the via 152, transistor 104 on via 154, transistor 202 on the via 214, transistor 204 on via 216. The material layer stack 414 (FIG. 4B) is patterned to form transistors 102, 104, 202 and 204. In an embodiment, a plasma etch process is utilized to etch the material layer stack 414 (FIG. 4B) and form gate electrode 102A, gate dielectric layer 102B and channel layer 102C in transistor 102, gate electrode 104A, gate dielectric layer 104B and channel layer 104C in transistor 104, gate electrode 202A, gate dielectric layer 202B and channel layer 202C in transistor 202, gate electrode 204A, gate dielectric layer 204B and channel layer 204C in transistor 204. The conductive material portions 142A, 142B, 144A, 144B, 206A, 206B, 210A, 210B are also formed by patterning conductive material 418, over the respective channel layers.

In an embodiment, a spacer 182A is formed laterally adjacent to sidewalls of transistor 102, a spacer 182B is formed laterally adjacent to sidewalls of the transistor 104, a spacer 226A is formed laterally adjacent to sidewalls of transistor 202, and a spacer 226B is formed laterally adjacent to sidewalls of the transistor 204 after patterning to form transistors. The spacers 182A, 182B, 226A and 226B laterally surround the respective transistors 102, 104, 202 and 204. In an embodiment, a spacer material is blanket deposited onto patterned transistor structures and then etched. In an embodiment, the spacer material includes silicon and nitrogen, or silicon and nitrogen and one or more of oxygen or carbon.

In an embodiment, a dielectric 424 is deposited on the transistors 102, 104, 202, 204, spacers 182A, 182B, 226A and 226B, etch stop layer 180, and planarized. In an embodiment, dielectric 424 includes a material that is the same or substantially the same as the material of the dielectric 404 (described in association with FIG. 4A) and is deposited by a method that is the same or substantially the same as the method of depositing dielectric 404 and includes a material that is the same or substantially the same as the material of the dielectric 404.

In the illustrative embodiment, the patterned conductive material above the respective channel layers in each of the transistors 102, 104, 202 and 204, are patterned to form source and drain structures for each transistor 102, 104, 202 and 204. As shown source structure 142B and a drain structure 142A are formed on channel layer 102C, source structure 144B and a drain structure 144A are formed on channel layer 104C, source structure 206B and a drain structure 206A are formed on channel layer 202C, and source structure 210B and a drain structure 210A are formed on channel layer 204C.

In an embodiment, insulators 156 158, 218 and 220 are formed by blanket depositing an insulator material on exposed portions of the channel layers 102C, 104C, 202C, and 204C and planarizing. In an embodiment, insulators 156 158, 218 and 220 include silicon and one or more of oxygen, nitrogen or carbon.

In the illustrative embodiment, a dielectric 426 is then blanket deposited on the dielectric 426 and on source structures 142B, 144B, 206B, 210B and on drain structures 142A, 144A, 206A, 210A and on upper portions of spacers, 182A, 182B, 226A and 226B. In an embodiment, dielectric 426 is blanket deposited by a (PECVD) or a chemical vapor deposition (CVD) process. In an embodiment, the dielectric 426 includes silicon and one or more of nitrogen, oxygen and carbon, for example, silicon nitride, silicon dioxide, carbon doped silicon nitride, silicon oxynitride or silicon carbide.

In an embodiment, interconnects 166 and 132 are formed by utilizing a plasma etch process to form openings in the dielectric 424 and 426, and metallization interconnects 164 and 126 are formed by utilizing a plasma etch process to form openings in the dielectric 426. A conductive material is deposited into the openings and planarized. In an embodiment, the conductive material the same or substantially the same as the material of the metallization interconnects 168 or 134.

In the illustrative embodiment, an etch stop layer 428 is then blanket deposited onto the dielectric 424 and on uppermost surfaces of metallization interconnects 164 and 126. In an embodiment, etch stop layer 428 includes a material that is the same or substantially the same as the material of the etch stop layer 180. In an embodiment, openings are formed in the etch stop layer 428 and in the dielectric 424 by a plasma etch process. The openings expose source structures 142B, 144B, 206B and 210B. A conductive material is deposited into each of the openings and then planarized to form metallization interconnects 147, 149, 222 and 224. In an embodiment, the conductive material utilized to form metallization interconnects 147, 149, 222 and 224 is the same or substantially the same as the material of the metallization interconnects 168. In the illustrative embodiment, the conductive material is planarized to form metallization interconnects 147, 149, 222 and 224 having uppermost surfaces that are at a level of an uppermost surface 428A of the etch stop layer 428.

A dielectric 430 is then blanket deposited on the surface of the etch stop layer 428 and on the metallization interconnects 147, 149, 222 and 224. In an exemplary embodiment, dielectric 430 includes a material that is the same or substantially the same as the material of the dielectric 426 and may be deposited using a same process. In an embodiment, openings are formed in the dielectric 430 and in the etch stop layer 428 by a plasma etch process. The openings expose drain structures 142A, 144A, 206A and 210A. A conductive material is deposited into each of the openings. In an embodiment, the conductive material is the same or substantially the same as the material of the metallization interconnect 147 or 149. In the illustrative embodiment, the conductive material is planarized to form metallization interconnects 146, 148, 208 and 212.

The uppermost surface 424A of the dielectric 424 (indicated by dashed lines) corresponds to the level 109.

Figure 4D:
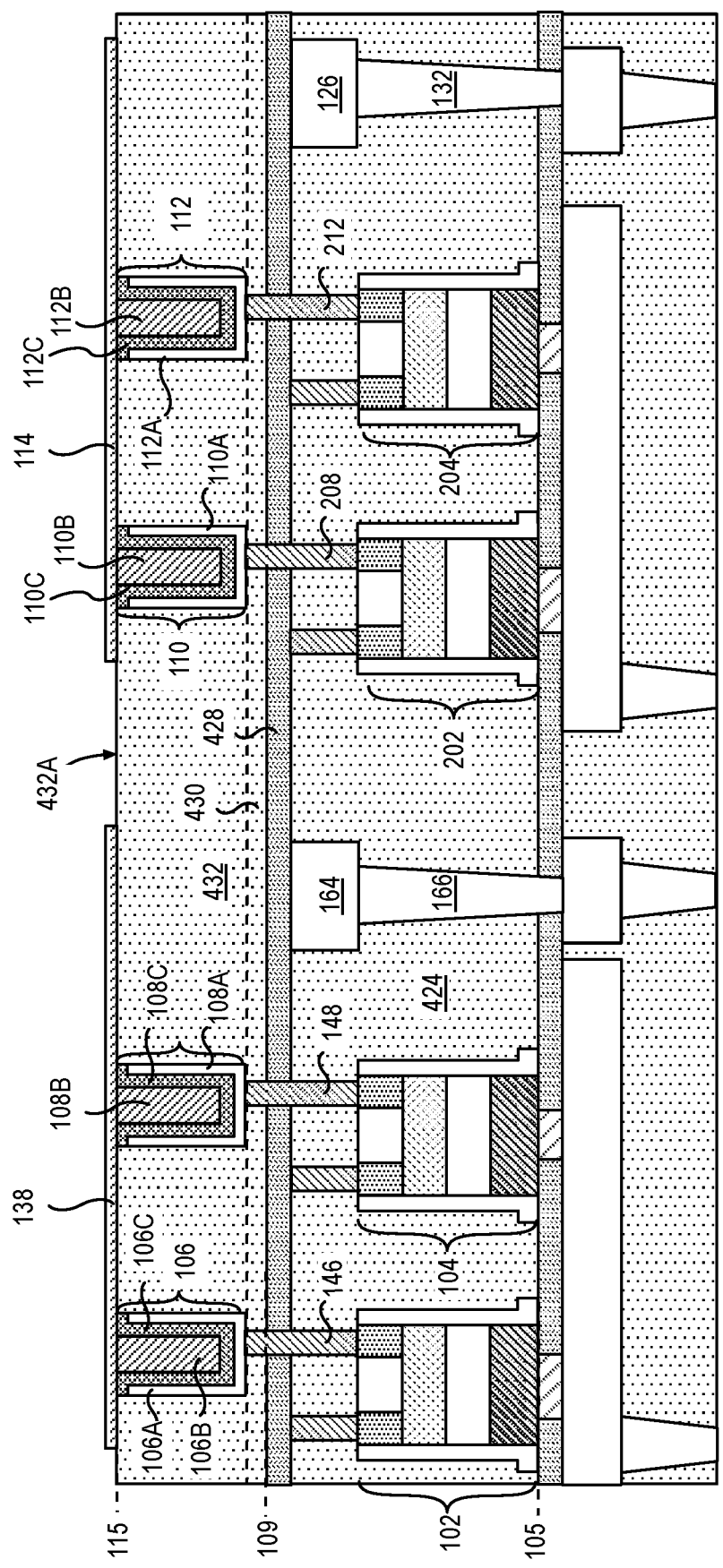
FIG. 4D is a cross-sectional illustration of the structure in FIG. 4C following the formation of a capacitor above each transistor in in the first and in the second regions, in accordance with an embodiment of the present disclosure.

FIG. 4D is a cross-sectional illustration of the structure in FIG. 4C following the formation of a capacitor above each transistor in each region 101A and 101B, in accordance with an embodiment of the present disclosure.

In an embodiment, dielectric 432 is then blanket deposited on the surface of the dielectric 430. In an exemplary embodiment, dielectric 432 includes a material that is the same or substantially the same as the material of the dielectric 430 and may be deposited by a PEVCD or a PVD process.

In an embodiment, openings are formed in the dielectric 432 to expose metallization interconnects 146, 148, 208 and 212. The openings may be formed by a plasma etch process. Fabrication of capacitors 106, 108, 110, and 112 includes deposition of an electrode material in the openings formed in the dielectric 432. The electrode material is deposited and maybe patterned to form electrodes 106A, 108A, 110A, and 112A. In embodiments, the electrode material utilized to form electrodes 106A, 108A, 110A, and 112A includes a material such as titanium nitride, tantalum and tantalum nitride.

In the illustrative embodiment, the electrodes 106A, 108A, 110A, and 112A are recessed below an uppermost surface of the dielectric 432 during the patterning process. An insulator layer is deposited on the electrodes 106A, 108A, 110A, and 112A. In an embodiment, the material of the insulator layer 106C, 108C, 110C, and 112C each include a dielectric material such as silicon dioxide, carbon-doped silicon glass or other low dielectric constant oxides. The insulator layer 106C, 108C, 110C, and 112C may be patterned or removed from above the dielectric 432 by a planarization process.

The deposition process is continued to form an electrode material on the insulator layer 106C, 108C, 110C, and 112C and on the dielectric 432. In an embodiment, the electrode material is blanket deposited into the openings and planarized. In an embodiment, the electrode material includes a conductive material such as titanium nitride, tantalum and tantalum nitride In some embodiments, a CMP process may be utilized to planarize the electrode material to form electrodes 106B, 108B, 110B, and 112B. The uppermost surface 432A of the dielectric 432 corresponds to the level 115.

In the illustrative embodiment, a conductive material is then blanket deposited on the uppermost surface 432A of dielectric 432 and on the electrodes 106C, 108B, 110B, and 112B and upper portions of insulators 106B, 108B, 110B, and 112B. In an embodiment, the conductive material includes ruthenium, tantalum nitride (TaN), tantalum (Ta), titanium zirconium nitride (e.g., TixZr1-xN, such as X=0.53), titanium nitride (e.g., TiN) or titanium tungsten (TiW) or tungsten to facilitate patterning. A mask may be formed on the conductive material and the conductive material may be etched to form a top conductive plate 138 that couples the capacitors in region 101A and form a top conductive plate 114 that couples the capacitors in region 101B.

Figure 4E:
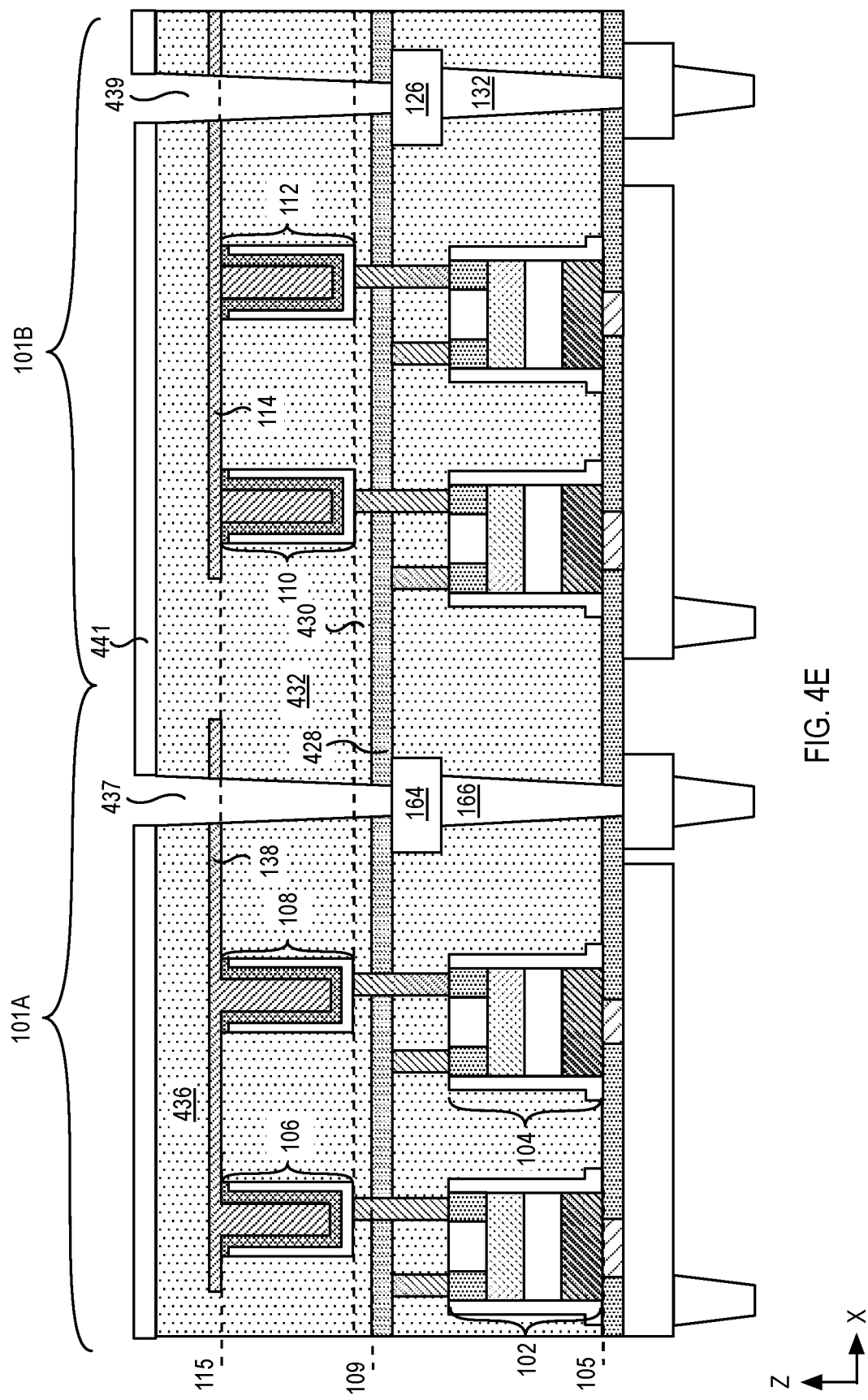
FIG. 4E is a cross-sectional illustration of the structure in FIG. 4D following the process to form interconnects that couple with top conductive plates above a plurality of capacitors in each of the first and the second regions.

FIG. 4E is a cross-sectional illustration of the structure in FIG. 4D following the process to form openings 437 and 439 to form interconnects that couple with top conductive plates 138 and 118. In an embodiment, a dielectric 436 is deposited on top conductive plates 138 and 118, and on dielectric 432. In an embodiment, dielectric 436 is then blanket deposited on the surface of the dielectric 432. In an exemplary embodiment, dielectric 436 includes a material that is the same or substantially the same as the material of the dielectric 432 and may be deposited by a PEVCD or a PVD process.

A mask 441 is then formed by a lithographic patterning technique on the dielectric 436. A plasma etch process is utilized to etch openings 437 and 439. In an embodiment, after etching dielectric 436, the plasma etch process is utilized to etch through the top conductive plates 138 and 118, through the dielectrics 432 and 430 and through the etch stop layer 428 to expose uppermost surfaces of metallization interconnects 164 and 126.

After the etching process the mask 441 is removed.

Figure 4F:
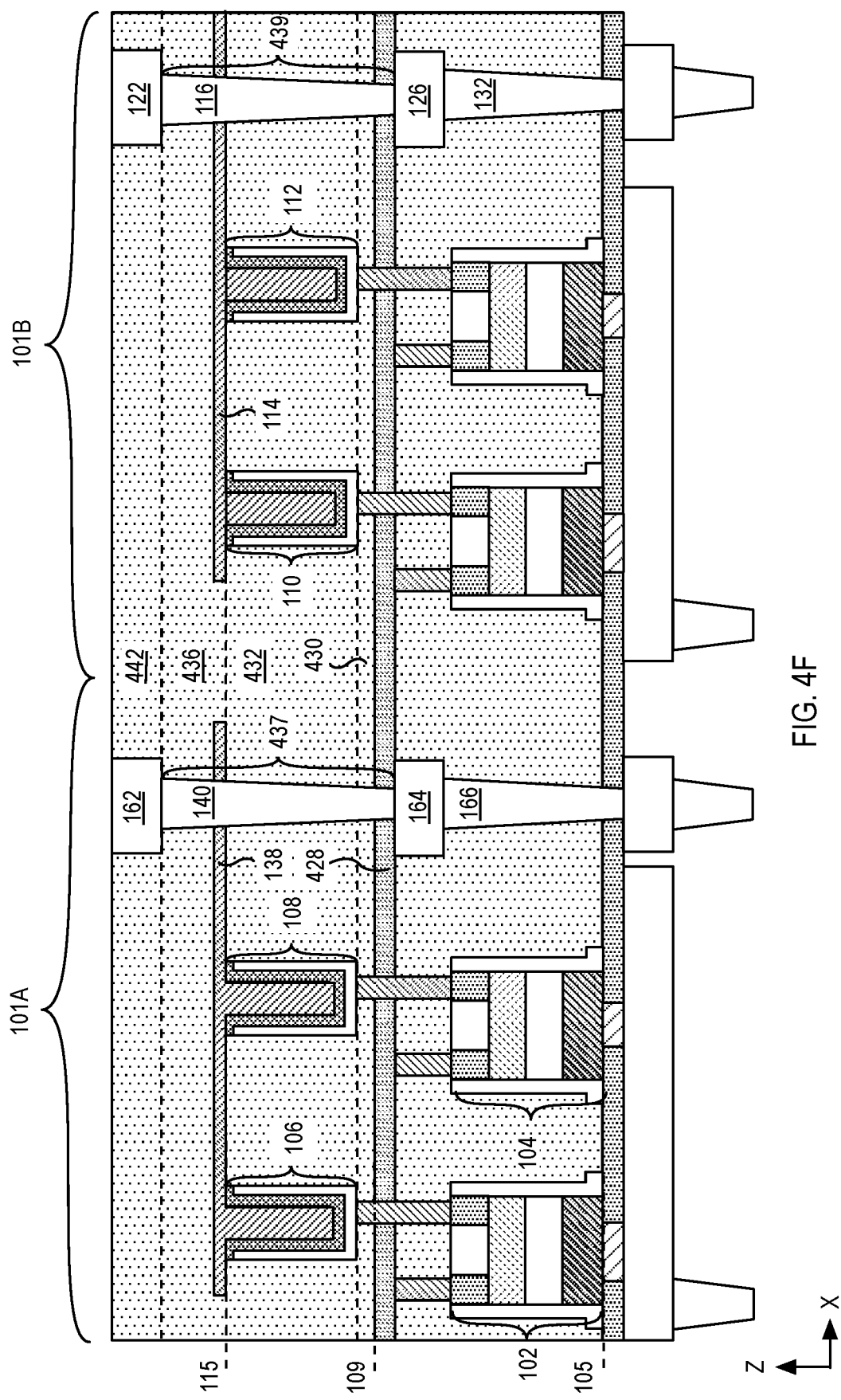
FIG. 4F is a cross-sectional illustration of the structure in FIG. 4E following the process to form an interconnect via and a metallization interconnect in the first region, and an interconnect and metallization interconnect in the second region.

FIG. 4F is a cross-sectional illustration of the structure in FIG. 4E following the process to form interconnect 140 and metallization interconnect 162 in region 101A, and interconnect 116 and metallization interconnect 122 in region 101B. In an embodiment, a conductive material is blanket deposited into the openings 437 and 439, on the metallization interconnects 164 and 126, on sidewalls of etch stop layer 428, on sidewalls of dielectric 430 and 432, on sidewalls of the top conductive plates 138 and 118, and on sidewalls of dielectric 436. In an embodiment, the conductive material is the same or substantially the same as the material of the interconnect 166. In some embodiments, a CMP process may be utilized to planarize the conductive material to form interconnects 140 and 116.

In an embodiment, a dielectric 442 is deposited on the dielectric 436 and on the uppermost surfaces of interconnects 140 and 116. Metallization interconnects 162 and 122 may be formed on the interconnects 140 and 116 by a method that is utilized to form metallization interconnects 164 and 126.

Figure 5A:
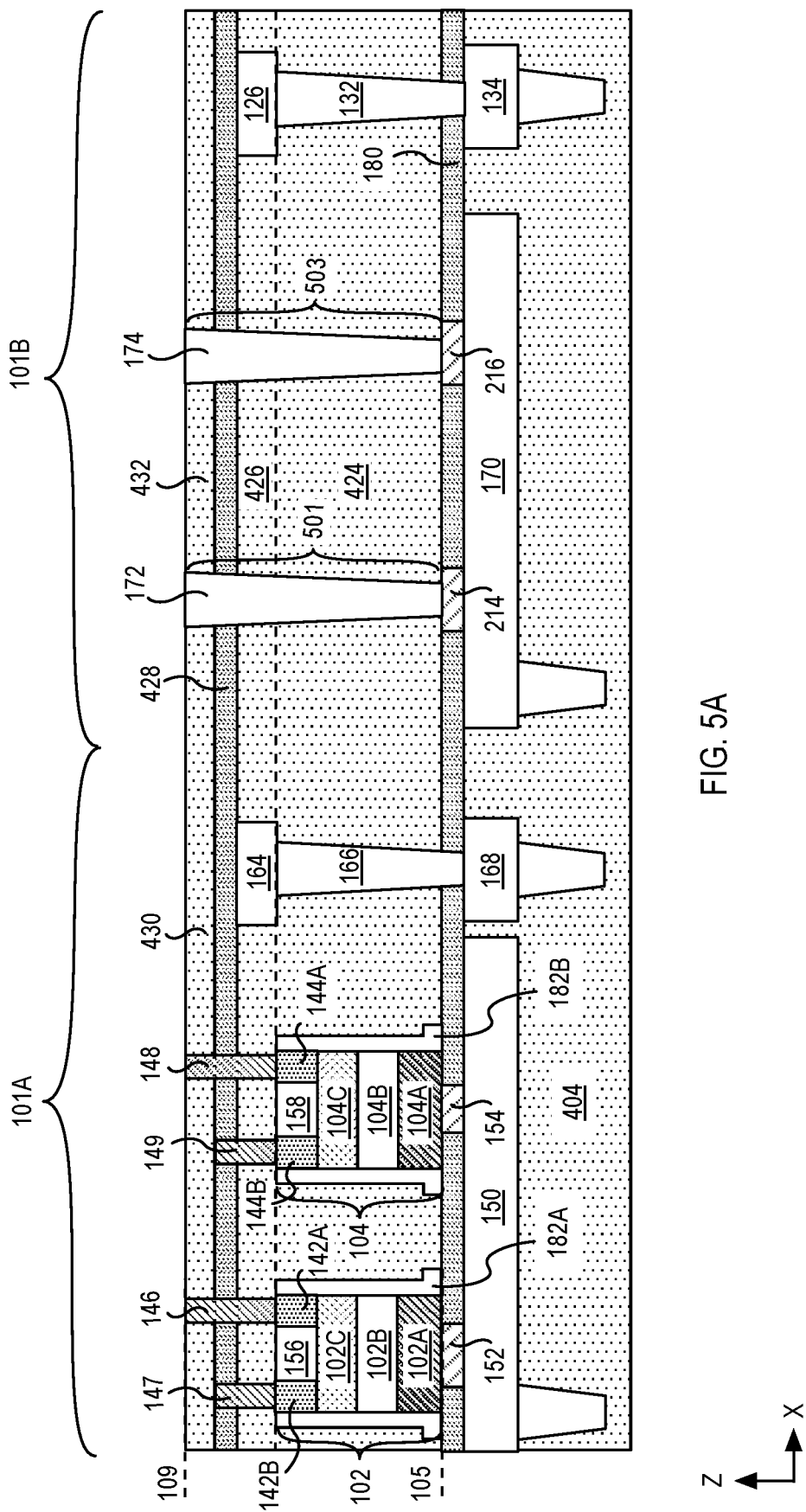
FIG. 5A is a cross-sectional illustration of the structure in FIG. 4C following the process to fabricate transistors, metallization interconnects in the first region, but no transistor or metallization interconnects in the second region.
Figure 5B:
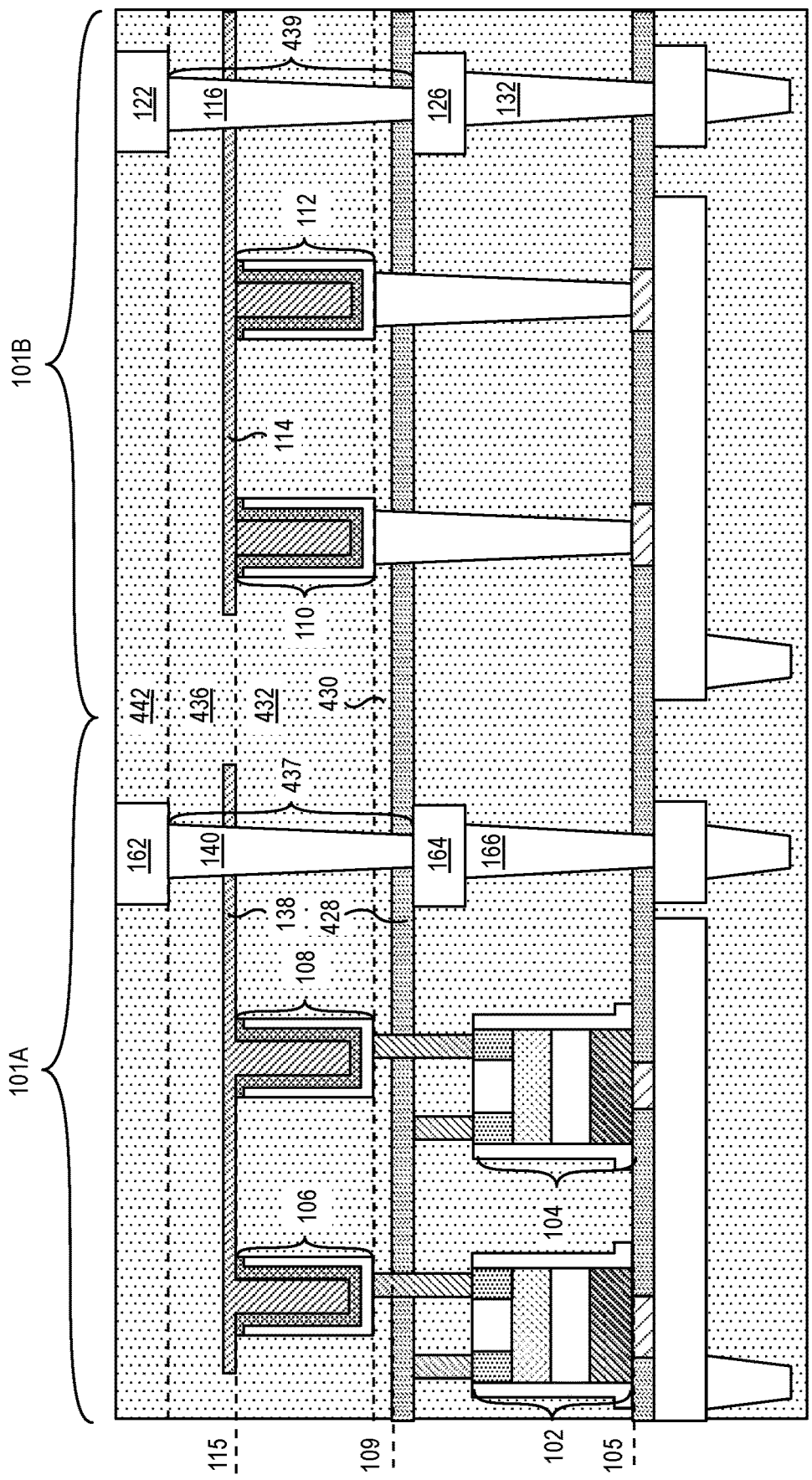
FIG. 5B is a cross-sectional illustration of the structure in FIG. 5A following the process to fabricate capacitors in the first and in the second regions.

FIGS. 5A-5B are cross-sectional illustrations of a method utilized to fabricate the device structure 100B (described in association with FIG. 1B), in accordance with an embodiment of the present disclosure.

FIG. 5A is a cross-sectional illustration of the structure in FIG. 4C following the process to fabricate transistors 102 and 104, metallization interconnects 147, 149, 146 and 148 in regions 101A, but no transistor or metallization interconnects in region 101B.

In an embodiment, openings 501 and 503 are formed by plasma etching the dielectric 430, the etch stop layer 428, the dielectric 426 and 424 to expose uppermost surfaces of vias 214 and 216.

In an embodiment, a conductive material is blanket deposited into the openings 501 and 503, on the vias 214 and 216, on sidewalls of dielectric 424 and 426, on sidewalls of etch stop layer 428, on sidewalls and on uppermost surface of dielectric 432. In an embodiment, the conductive material is the same or substantially the same as the material of the interconnect 166. In some embodiments, a CMP process may be utilized to planarize the conductive material to form vias 172 and 174 in region 101B. The region 101A may masked during the etching to form openings 501 and 503 and removed before deposition of the conductive material.

FIG. 5B is a cross-sectional illustration of the structure in FIG. 5A following the process to fabricate capacitors 106, 108, 110 and 112. In an embodiment, a process utilized to fabricate capacitors 106, 108, 110 and 112, and top conductive plates 138 and 114 described in association with FIG. 4D is utilized to fabricate capacitors 106, 108, 110 and 112 in FIG. 5B. In an embodiment, interconnects 140 and 116 and metallization interconnects 162 and 122 may be fabricated using methods described in association with FIG. 4F.

Figure 6C:
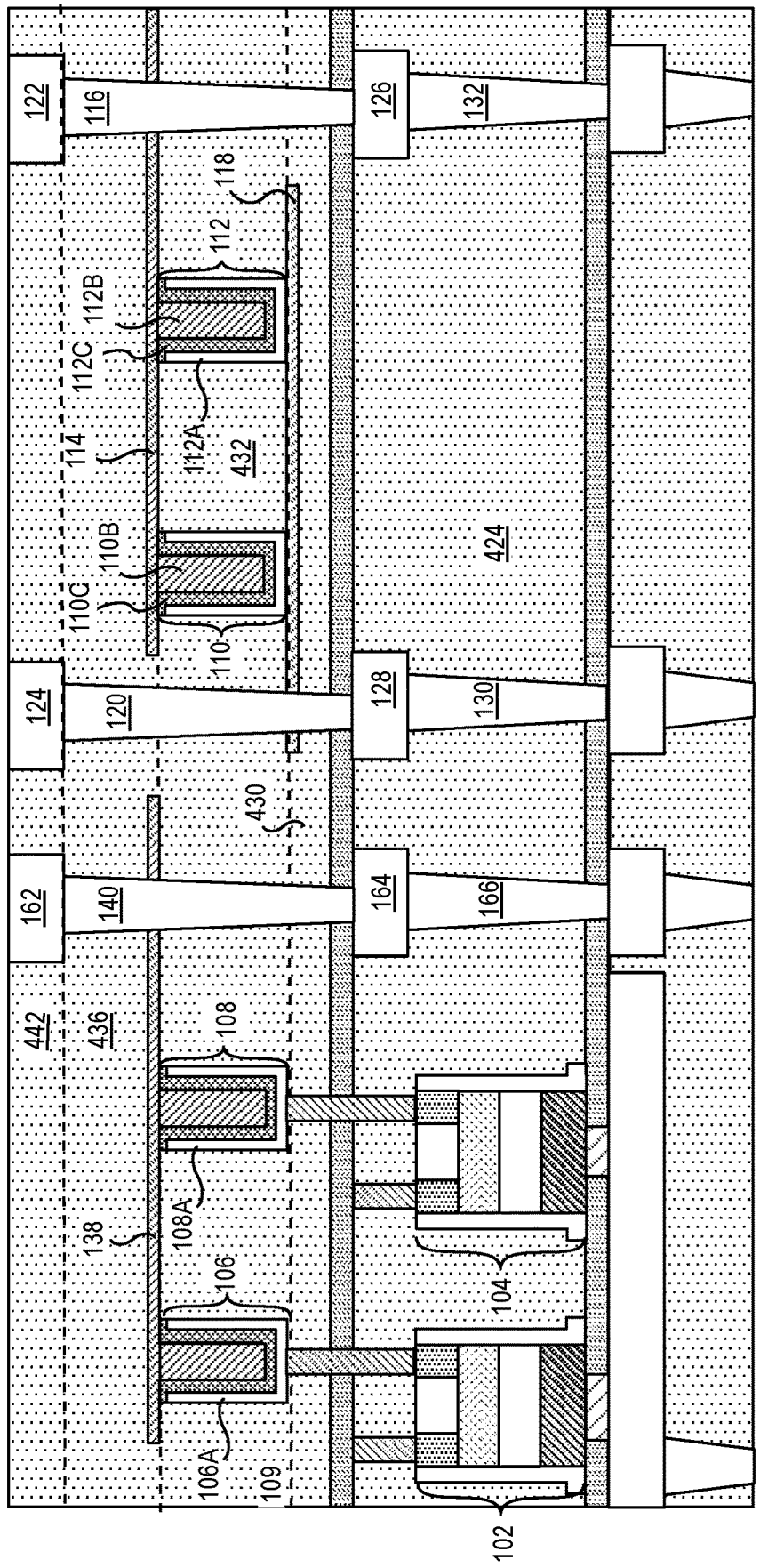
FIG. 6C is a cross-sectional illustration of the structure in FIG. 6B following the process to fabricate capacitors, an interconnect and a metallization interconnect in the first region and capacitors, interconnects and metallization interconnects in the second region, in accordance with an embodiment of the present disclosure.

FIGS. 6A-6C are cross-sectional illustrations of a method utilized to fabricate the device structure 100A, in accordance with an embodiment of the present disclosure.

FIG. 6A is a cross-sectional illustration of a workpiece 600, in accordance with an embodiment of the present disclosure. In an embodiment, the work piece 600 is substantially similar to the workpiece 400 in FIG. 4A, except for that the word line 170 is not fabricated in region 101B. In the illustrative embodiment, via 604 is fabricated at the same time as via 406, 408 and 412, and metallization interconnect 136 is fabricated at the same time as metallization interconnect 168.

FIG. 6B is a cross-sectional illustration of the structure in FIG. 6A following the process to fabricate transistors 102 and 104, interconnect 166 and metallization interconnect 164 in region 101A, and interconnects 130 and 132 and metallization interconnects 126 and 128 in region 101B. In an embodiment, the process to fabricate transistors 102 and 104 is described in association with FIG. 4B-4C. No transistors are formed in region 101B.

Method of fabricating interconnect 166 and metallization interconnect 164 in region 101A, and interconnect 132 and metallization interconnect 126 in region 101B have been described above in association with FIG. 4C. In the illustrative embodiment, interconnect 130 and metallization interconnect 128 are fabricated at the same time and using a same process as that utilized to fabricate interconnect 132 and metallization interconnect 126.

After formation of the etch stop layer 428, dielectric 430, metallization interconnects 146 and 148, a bottom conductive plate 118 is formed on the dielectric 430. In the illustrative embodiment, a conductive material is blanket deposited and patterned to form bottom conductive plate 118. The bottom conductive plate 118 is deposited to a thickness between 5 nm and 20 nm. In an exemplary embodiment, the material of the bottom conductive plate 118 is chosen to provide ease of etch patterning and does not include copper. The bottom conductive plate 118 is also etched through at a latter process operation to provide an interconnect path.

FIG. 6C is a cross-sectional illustration of the structure in FIG. 6B following the process to fabricate capacitors 106 and 108, interconnect 140 and metallization interconnect 162 in region 101A and capacitors 110 and 112, interconnects 120 and 116 and metallization interconnects 122 and 124 in region 101B, in accordance with an embodiment of the present disclosure.

The method to fabricate capacitors 106, 108, 110 and 112, have been described above in association with FIG. 4D. The difference is that capacitors 110 and 112 in FIG. 6C are fabricated on the bottom conductive plate 118. Hence, alignment between openings in dielectric 432 and the bottom conductive plate 118 is less important. After fabrication of the top conductive plate 114, the method to fabricate interconnects 140 and 116 and metallization interconnects 162 and 122 may be performed using methods described in association with FIG. 4F. Interconnect 120 and metallization interconnect 124 may be fabricated before or after fabrication of interconnects 140 and 116 and metallization interconnects 162 and 122.

In an embodiment, interconnects 140 and 116 and metallization interconnects 162 and 122 may be fabricated using methods described in association with FIG. 4F.

Figure 7:
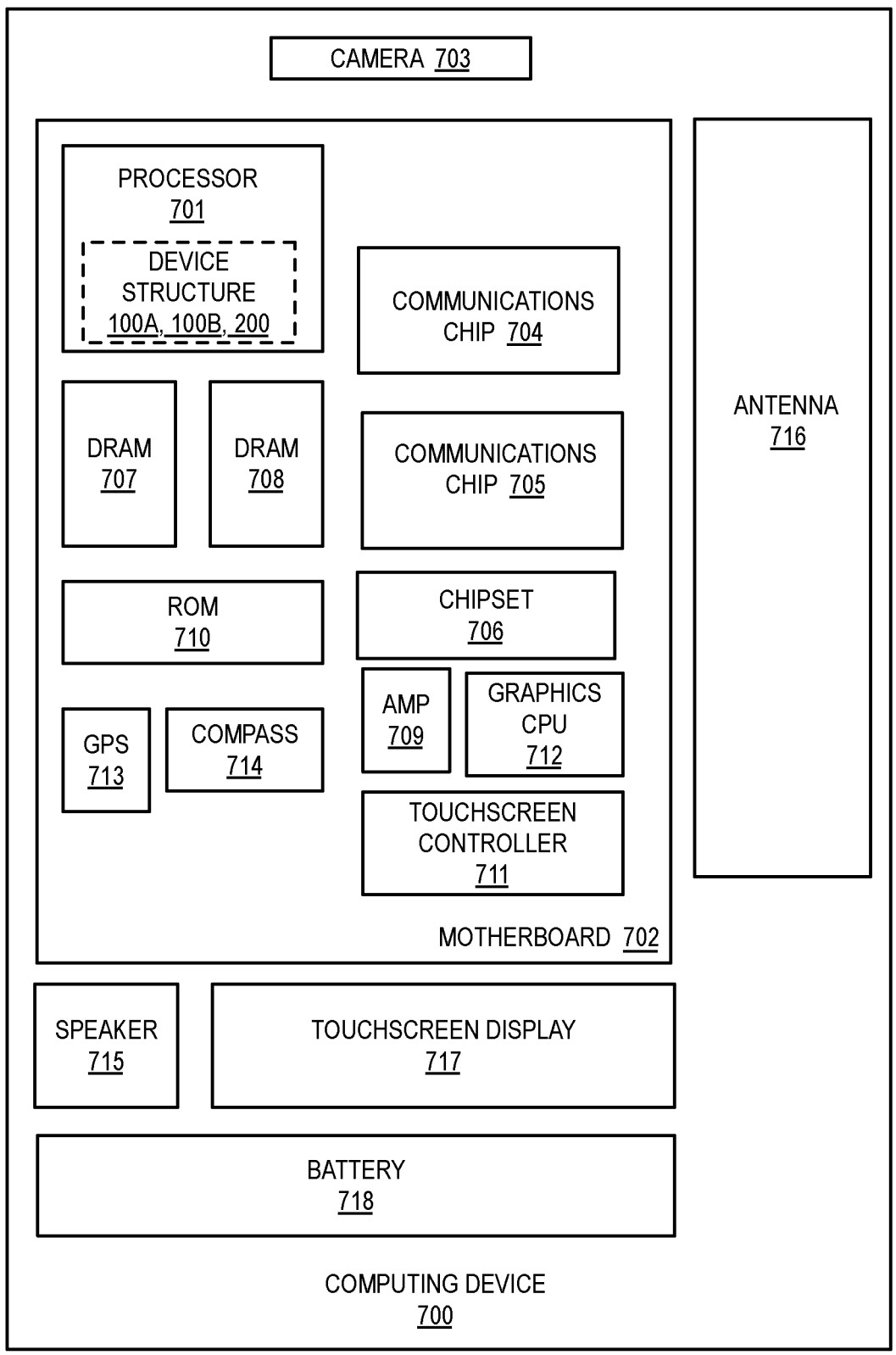
FIG. 7 illustrates a computing device in accordance with embodiments of the present disclosure.

FIG. 7 illustrates a computing device 700 in accordance with embodiments of the present disclosure. As shown, computing device 700 houses a motherboard 702. Motherboard 702 may include a number of components, including but not limited to a processor 701 and at least one communications chip 704 or 705. Processor 701 is physically and electrically coupled to the motherboard 702. In some implementations, communications chip 705 is also physically and electrically coupled to motherboard 702. In further implementations, communications chip 705 is part of processor 701.

Depending on its applications, computing device 700 may include other components that may or may not be physically and electrically coupled to motherboard 702. These other components include, but are not limited to, volatile memory (e.g., DRAM), non-volatile memory (e.g., ROM), flash memory, a graphics processor, a digital signal processor, a crypto processor, a chipset 706, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

Communications chip 705 enables wireless communications for the transfer of data to and from computing device 700. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. Communications chip 705 may implement any of a number of wireless standards or protocols, including but not limited to Wi-Fi (IEEE 701.11 family), WiMAX (IEEE 701.11 family), long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 7G, and beyond. Computing device 700 may include a plurality of communications chips 704 and 707. For instance, a first communications chip 705 may be dedicated to shorter range wireless communications such as Wi-Fi and Bluetooth and a second communications chip 704 may be dedicated to longer range wireless communications such as GPS, EDGE, GPRS, CDMA, WiMAX, LTE, Ev-DO, and others.

Processor 701 of the computing device 700 includes an integrated circuit die packaged within processor 701. In some embodiments, the integrated circuit die of processor 701 includes non-volatile memory devices, one or more device structures such as device structures 100A, 100B or 100C that include transistors coupled with capacitors in a first region and decoupling capacitors in an adjacent region, as described in association with FIGS. 1A, 1B, 2A-C. Referring again to FIG. 7, the term "processor" may refer to any device or portion of a device that processes electronic data from registers and/or memory to transform that electronic data into other electronic data that may be stored in registers and/or memory.

Communications chip 705 also includes an integrated circuit die packaged within communication chip 705. In another embodiment, the integrated circuit die of communications chips 704, 707 includes one or more interconnect structures, non-volatile memory devices, capacitors. Depending on its applications, computing device 700 may include other components that may or may not be physically and electrically coupled to motherboard 702. These other components may include, but are not limited to, volatile memory (e.g., DRAM) 707, 708, non-volatile memory (e.g., ROM) 710, a graphics CPU 712, flash memory, global positioning system (GPS) device 713, compass 714, a chipset 706, an antenna 716, a power amplifier 709, a touchscreen controller 711, a touchscreen display 717, a speaker 715, a camera 703, and a battery 718, as illustrated, and other components such as a digital signal processor, a crypto processor, an audio codec, a video codec, an accelerometer, a gyroscope, and a mass storage device (such as hard disk drive, solid state drive (SSD), compact disk (CD), digital versatile disk (DVD), and so forth), or the like. In further embodiments, any component housed within computing device 700 and discussed above may contain a stand-alone integrated circuit memory die that includes one or more arrays of nonvolatile memory devices.

In various implementations, the computing device 700 may be a laptop, a netbook, a notebook, an Ultrabook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, or a digital video recorder. In further implementations, the computing device 700 may be any other electronic device that processes data.

Figure 8:
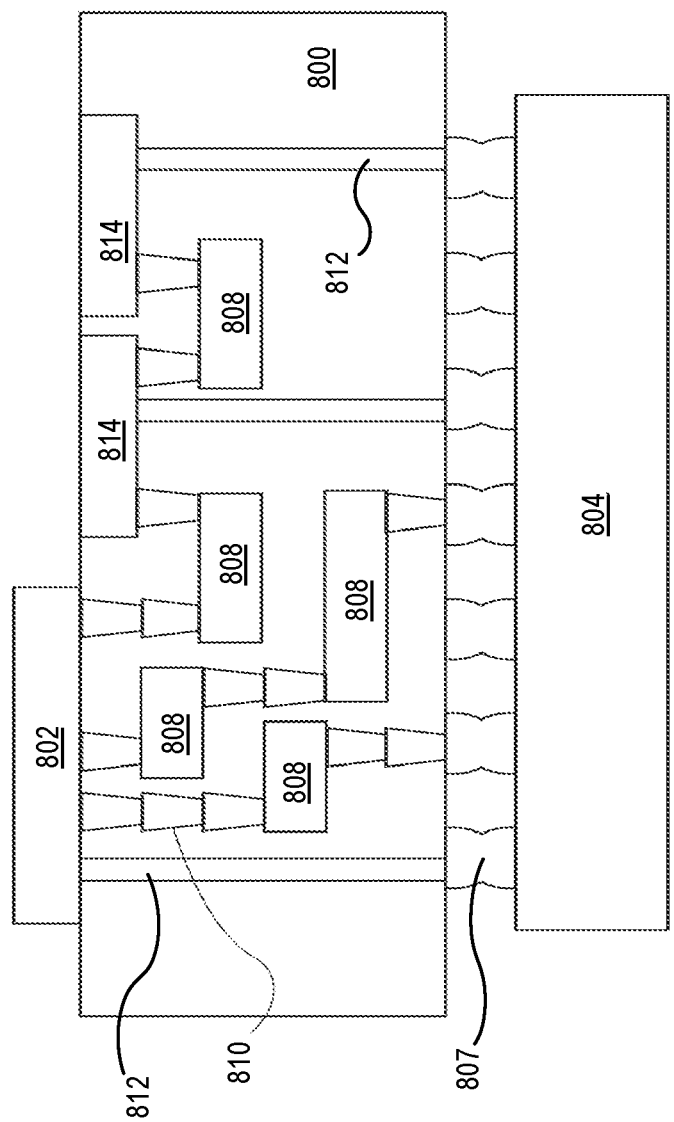
FIG. 8 illustrates an integrated circuit (IC) structure.

FIG. 8 illustrates an integrated circuit (IC) structure 800 that includes one or more embodiments of the disclosure. The integrated circuit (IC) structure 800 is an intervening substrate used to bridge a first substrate 802 to a second substrate 804. The first substrate 802 may be, for instance, an integrated circuit die. The second substrate 804 may be, for instance, a memory module, a computer mother, or another integrated circuit die. Generally, the purpose of an integrated circuit (IC) structure 800 is to spread a connection to a wider pitch or to reroute a connection to a different connection. For example, an integrated circuit (IC) structure 800 may couple an integrated circuit die to a ball grid array (BGA) 807 that can subsequently be coupled to the second substrate 804. In some embodiments, the first substrate 802 and the second substrate 804 are attached to opposing sides of the integrated circuit (IC) structure 800. In other embodiments, the first substrate 802 and the second substrate 804 are attached to the same side of the integrated circuit (IC) structure 800. And in further embodiments, three or more substrates are interconnected by way of the integrated circuit (IC) structure 800.

The integrated circuit (IC) structure 800 may be formed of an epoxy resin, a fiberglass-reinforced epoxy resin, a ceramic material, or a polymer material such as polyimide. In further implementations, the integrated circuit (IC) structure may be formed of alternate rigid or flexible materials that may include the same materials described above for use in a semiconductor substrate, such as silicon, germanium, and other group III-V and group IV materials.

The integrated circuit (IC) structure may include metal interconnects 808 and vias 810, including but not limited to through-silicon vias (TSVs) 812. The integrated circuit (IC) structure 800 may further include embedded devices 814, including both passive and active devices. Such embedded devices 814 include capacitors, resistors, inductors, fuses, diodes, transformers, device structure including transistors, one or more device structures such as device structures 100A, 100B or 100C that include transistors coupled with capacitors in a first region and decoupling capacitors in an adjacent region, as described in association with FIGS. 1A, 1B, 2A-C. Referring again to FIG. 8, the integrated circuit (IC) structure 800 may further include embedded devices such as one or more resistive random-access devices, sensors, and electrostatic discharge (ESD) devices. More complex devices such as radiofrequency (RF) devices, power amplifiers, power management devices such as decoupling capacitors (as described in association with FIGS. 1A, 1B, 2A-C), antennas, arrays, sensors, and MEMS devices may also be formed on the integrated circuit (IC) structure 800.

Example 1: The device structure includes a plurality of transistors laterally spaced apart along a first direction on a first level in a first region. A first plurality of capacitors are on a second level, above the first level, where a first electrode of the individual ones of the first plurality of capacitors are coupled with a respective transistor in the plurality of transistors. A second plurality of capacitors are laterally spaced apart along the first direction on the second level in a second region adjacent to the first region, where individual ones of the second plurality of capacitors include a second electrode, a third electrode and an insulator layer therebetween, where the second electrode of the individual ones of the plurality of capacitors are coupled with a first interconnect on a third level above the second level, and where the third electrode of the individual ones of the plurality of capacitors are coupled with a second interconnect.

Example 2: The device structure according to example 1, where the second electrodes of the individual ones of the second plurality of capacitors are coupled together by a first conductive plate above the respective second electrodes, the first conductive plate laterally extending to the first interconnect.

Example 3: The device structure according to any of one examples 1 through 2, where the third electrodes of the individual ones of the second plurality of capacitors are coupled together by a second conductive plate below the respective third electrodes, the second conductive plate laterally extending to the second interconnect.

Example 4: The device structure according to any of one examples 1 through 3, where the first interconnect is a first via and where the first conductive plate divides the second via into two vertical portions and where the second interconnect is a second via and where the conductive plate divides the second via into two vertical portions.

Example 5: The device structure according to any of one examples 1 through 4, where the first plurality of capacitors has a first width and a first height, and the second plurality of capacitors has the first width and the first height.

Example 6: The device structure according to any of one examples 1 through 5, where the individual ones of the second plurality of capacitors have a lateral width that is up to three time greater than a lateral width of the individual ones of the first plurality of capacitors.

Example 7: The device structure according to any of one examples 1 through 6, where the insulator layer is a first insulator layer, and where the first conductive plate laterally extends over a third plurality of capacitors laterally spaced apart along a direction parallel to the first direction, where individual ones of the third plurality of capacitors include a fourth electrode, a fifth electrode and an second insulator layer therebetween, and where the fourth electrode of the individual ones of the plurality of capacitors are coupled with the first conductive plate.

Example 8: The device structure according to any of one examples 1 through 7, where the second conductive plate laterally extends under the third plurality of capacitor and couples with the fifth electrode of the individual ones of the third plurality of capacitors.

Example 9: The device structure according to any of one examples 1 through 2, where the device structure further includes a first word line on a fourth level below the first level in the first region, the first word line coupled with a gate electrode of a respective transistor in the plurality of transistors. A second word line is on the fourth level in the second region. A plurality of vias is on and in contact with an uppermost surface of the second word line, where individual ones of the plurality of vias are further coupled with a respective third electrode of the individual ones of the second plurality of capacitors.

Example 10: The device structure according to example 9, where the insulator layer is a first insulator layer and the plurality of vias is a first plurality of vias, and where the device structure further includes a fourth plurality of capacitors on the second level in the second region, where the fourth plurality of capacitors include a sixth electrode, a seventh electrode and a third insulator layer there between. A third word line is on the fourth level in the second region, the third word line parallel to the second word line and a second plurality of vias is on and in contact with an uppermost surface of the third word line, where individual ones of the plurality of vias are further coupled with a respective seventh electrode of the individual ones of the fourth plurality of capacitors.

Example 11: The device structure includes a first plurality of transistors on a first level in a first region and a first plurality of capacitors on a second level, above the first level, where individual ones of a first electrode of the first plurality of capacitors are coupled with a terminal of a respective transistor in the plurality of transistors, and where individual ones of a second electrode of the first plurality of capacitors are coupled with a first interconnect. A first word line is coupled with a respective gate of the first plurality of transistors and a second plurality of transistors on the first level in a second region, adjacent the first region, where individual ones of second plurality of transistors include a gate electrode, a first terminal and a second terminal. A second plurality of capacitors is on the second level, where individual ones of a first electrode of the second plurality of capacitors are coupled with the first terminal of a respective transistor in the second plurality of transistors, and where individual ones of a second electrode of the second plurality of capacitors are coupled with a second interconnect, and where the second terminal of the individual ones of the second plurality of transistors are coupled with each other through a third interconnect. A second word line is coupled with a respective gate electrode of the first plurality of transistors.

Example 12: The device structure according to example 11, where the second electrodes of the individual ones of the second plurality of capacitors are coupled together by a first conductive plate laterally extending to the first interconnect.

Example 13: The device structure according to any of one examples 11 through 12, where the first interconnect is a first via and where the first conductive plate divides the second via into two vertical portions.

Example 14: The device structure according to any of one examples 11 through 14, where the second terminal of the individual ones of the second plurality of transistors are coupled with a respective metallization interconnect that extend in a direction that is orthogonal to a longitudinal direction of the second word line, and where the respective metallization interconnect couples with the third interconnect.

Example 15: The device structure according to any of one examples 11 through 14, further including a third word line parallel to the second word line, where the third wordline further includes a third plurality of transistors on the first level in the second region, where individual ones of third plurality of transistors include a gate electrode, a first terminal and a second terminal. A third plurality of capacitors is on the second level, where individual ones of a first electrode of the third plurality of capacitors are coupled with the first terminal of a respective transistor in the third plurality of transistors, and where individual ones of a second electrode of the third plurality of capacitors are coupled with a fourth interconnect, and where the second terminal of the individual ones of the second plurality of transistors are coupled with each other through the third interconnect.

Example 16: The device structure according to any of one examples 11 through 15, where the second wordline and the third wordline are coupled together by a fifth interconnect.

Example 17: The device structure according to any of one examples 11 through 16, where the individual ones of the second plurality of capacitors have a lateral width that is up to three time greater than a lateral width of the individual ones of the first plurality of capacitors.

Example 18: A system includes a battery, an antenna, and a processor coupled to the antenna, where the processors includes a device structure including a plurality of transistors that are laterally spaced apart along a first direction on a first level in a first region. A first plurality of capacitors are on a second level, above the first level, where a first electrode of the individual ones of the first plurality of capacitors are coupled with a respective transistor in the plurality of transistors. A second plurality of capacitors are laterally spaced apart along the first direction on the second level in a second region adjacent to the first region, where individual ones of the second plurality of capacitors include a second electrode, a third electrode and an insulator layer therebetween, where the second electrode of the individual ones of the plurality of capacitors are coupled with a first interconnect on a third level above the second level, and where the third electrode of the individual ones of the plurality of capacitors are coupled with a second interconnect.

Example 19: The system according to example 18, where the second electrodes of the individual ones of the second plurality of capacitors are coupled together by a first conductive plate laterally extending to the first interconnect.

Example 20: The system according to example 18, where the third electrodes of the individual ones of the second plurality of capacitors are coupled together by a second conductive plate laterally extending to the second interconnect.

Device structures including capacitors coupled with transistors in a first region and decoupling capacitors in an adjacent region are described herein. In the above description, for purposes of explanation, numerous specific details are set forth in order to provide a thorough understanding of certain embodiments. It will be apparent, however, to one skilled in the art that certain embodiments can be practiced without these specific details. In other instances, structures and devices are shown in block diagram form in order to avoid obscuring the description.

Besides what is described herein, various modifications may be made to the disclosed embodiments and implementations thereof without departing from their scope. Therefore, the illustrations and examples herein should be construed in an illustrative, and not a restrictive sense. The scope of the invention should be measured solely by reference to the claims that follow.

What is claimed is:

1. A device structure comprising:
 a plurality of transistors laterally spaced apart along a first direction on a first level in a first region;
 a first plurality of capacitors on a second level, above the first level, wherein a first electrode of the individual ones of the first plurality of capacitors are coupled with a respective transistor in the plurality of transistors; and
 a second plurality of capacitors laterally spaced apart along the first direction on the second level in a second region adjacent to the first region, wherein individual ones of the second plurality of capacitors comprise:
  a second electrode, a third electrode, and an insulator layer therebetween, wherein the second electrode of the individual ones of the second plurality of capacitors are coupled with a first interconnect on a third level above the second level, a first conductive plate couples the first interconnect and divides the first interconnect into first and second portions, the first portion above the first conductive plate, the first conductive plate above the second portion, the third electrode of the individual ones of the second plurality of capacitors are coupled with a second interconnect, and a second conductive plate couples the second interconnect and divides the second interconnect into third and fourth portions, the third portion above the second conductive plate, the second conductive plate above the fourth portion.

2. The device structure of claim 1, wherein the first conductive plate is above the respective second electrodes, the first interconnect is a first via, the first conductive plate laterally extending to the first via, and the first and second portions are vertical portions of the first via.

3. The device structure of claim 2, wherein the second conductive plate is below the respective third electrodes, the second interconnect is a second via, the second conductive plate laterally extending to the second via, and the third and fourth portions are vertical portions of the second via.

4. The device structure of claim 2, wherein the insulator layer is a first insulator layer, and wherein the first conductive plate laterally extends over a third plurality of capacitors laterally spaced apart along a direction parallel to the first direction, wherein individual ones of the third plurality of capacitors comprise a fourth electrode, a fifth electrode, and an second insulator layer therebetween, and wherein the fourth electrode of the individual ones of the third plurality of capacitors are coupled with the first conductive plate.

5. The device structure of claim 4, wherein the second conductive plate laterally extends under the third plurality of capacitors and couples with the fifth electrode of the individual ones of the third plurality of capacitors.

6. The device structure of claim 1, wherein the device structure is coupled with a motherboard.

7. The device structure of claim 1, wherein the first plurality of capacitors has a first width and a first height, and the second plurality of capacitors has the first width and the first height.

8. The device structure of claim 1, wherein the individual ones of the second plurality of capacitors have a lateral width that is up to three time greater than a lateral width of the individual ones of the first plurality of capacitors.

9. The device structure of claim 1, wherein the device structure further comprises:
- a first word line on a fourth level below the first level in the first region, the first word line coupled with a gate electrode of a respective transistor in the plurality of transistors;
- a second word line on the fourth level in the second region; and
- a plurality of vias on and in contact with an uppermost surface of the second word line, wherein individual ones of the plurality of vias are further coupled with a respective third electrode of the individual ones of the second plurality of capacitors.

10. The device structure of claim 9, wherein the insulator layer is a first insulator layer and the plurality of vias is a first plurality of vias, and wherein the device structure further comprises:
- a fourth plurality of capacitors on the second level in the second region, wherein the fourth plurality of capacitors comprise a sixth electrode, a seventh electrode, and a third insulator layer there between;
- a third word line on the fourth level in the second region, the third word line parallel to the second word line; and
- a second plurality of vias on and in contact with an uppermost surface of the third word line, wherein individual ones of the second plurality of vias are further coupled with a respective seventh electrode of the individual ones of the fourth plurality of capacitors.

11. A device structure comprising:
- a first plurality of transistors on a first level in a first region;
- a first plurality of capacitors on a second level, above the first level, wherein individual ones of a first electrode of the first plurality of capacitors are coupled with a terminal of a respective transistor in the first plurality of transistors, and wherein individual ones of a second electrode of the first plurality of capacitors are coupled with a first interconnect;
- a first word line coupled with a respective gate of the first plurality of transistors;
- a second plurality of transistors on the first level in a second region, adjacent the first region, wherein individual ones of the second plurality of transistors comprise:
  - a respective gate electrode;
  - a first terminal; and
  - a second terminal;
- a second plurality of capacitors on the second level, wherein individual ones of the second plurality of capacitors comprise respective first and second electrodes, individual ones of the first electrodes of the second plurality of capacitors are coupled with the first terminal of a respective transistor in the second plurality of transistors, individual ones of the second electrodes of the second plurality of capacitors are coupled with a second interconnect, and the second terminal of the individual ones of the second plurality of transistors are coupled with each other through a third interconnect; and
- a second word line coupled with a respective gate electrode of the first-second plurality of transistors.

12. The device structure of claim 11, wherein the second electrodes of the individual ones of the second plurality of capacitors are coupled together by a conductive plate laterally extending to the first interconnect.

13. The device structure of claim 12, wherein the first interconnect is a via and wherein the conductive plate divides the via into two vertical portions.

14. The device structure of claim 13, wherein the second terminal of the individual ones of the second plurality of transistors are coupled with a respective metallization interconnect that extend in a direction that is orthogonal to a longitudinal direction of the second word line, and wherein the respective metallization interconnect couples with the third interconnect.

15. The device structure of claim 11, further comprising a third word line parallel to the second word line, wherein the third word line further comprises:
- a third plurality of transistors on the first level in the second region, wherein individual ones of third plurality of transistors comprise:
  - a respective gate electrode;
  - a respective first terminal; and
  - a respective second terminal; and
- a third plurality of capacitors on the second level, wherein individual ones of the third plurality of capacitors comprise respective first and second electrodes, individual ones of the first electrodes of the third plurality of capacitors are coupled with the first terminal of a respective transistor in the third plurality of transistors, individual ones of the second electrodes of the third plurality of capacitors are coupled with a fourth interconnect, and the second terminal of the individual ones of the second plurality of transistors are coupled with each other through the third interconnect.

16. The device structure of claim 15, wherein the second word line and the third word line are coupled together by a fifth interconnect.

17. The device structure of claim 11, wherein the individual ones of the second plurality of capacitors have a lateral width that is up to three time greater than a lateral width of the individual ones of the first plurality of capacitors.

18. The device structure of claim 11, wherein the individual ones of the first plurality of capacitors have a first width and a first height, and the individual ones of the second plurality of capacitors have the first width and the first height.

19. The device structure of claim 11, wherein:
- the first electrodes of the individual ones of the second plurality of capacitors are coupled together by a first conductive plate above the respective first electrodes, the first conductive plate laterally extending to the first interconnect;
- the second electrodes of the individual ones of the second plurality of capacitors are coupled together by a second conductive plate below the respective second electrodes, the second conductive plate laterally extending to the second interconnect;
- the first interconnect is a first via;
- the first conductive plate divides the first via into first and second portions, the first portion
  - above the first conductive plate, the first conductive plate above the second portion;
- the second interconnect is a second via; and
- the second conductive plate divides the second via into third and fourth portions, the third portion above the second conductive plate, the second conductive plate above the fourth portion.

20. The device structure of claim 11, wherein the device structure is coupled with a motherboard.

\* \* \* \* \*